United States Patent
Lee et al.

(10) Patent No.: US 11,778,076 B2
(45) Date of Patent: Oct. 3, 2023

(54) BROADCASTING SIGNAL FRAME GENERATION APPARATUS AND METHOD USING LAYERED DIVISIONAL MULTIPLEXING

(71) Applicant: ELECTRONICS AND TELECOMMUNICATIONS RESEARCH INSTITUTE, Daejeon (KR)

(72) Inventors: Jae-Young Lee, Daejeon (KR); Heung-Mook Kim, Daejeon (KR); Sung-Ik Park, Daejeon (KR); Sun-Hyoung Kwon, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 0 days.

(21) Appl. No.: 17/882,848

(22) Filed: Aug. 8, 2022

(65) Prior Publication Data

US 2022/0394115 A1      Dec. 8, 2022

Related U.S. Application Data

(63) Continuation of application No. 16/840,565, filed on Apr. 6, 2020, now Pat. No. 11,451,649, which is a
(Continued)

(30) Foreign Application Priority Data

Jan. 8, 2015    (KR) .................. 10-2015-0002588
Jan. 6, 2016    (KR) .................. 10-2016-0001735

(51) Int. Cl.
*H04L 69/324*      (2022.01)
*H04L 5/00*        (2006.01)
(Continued)

(52) U.S. Cl.
CPC ............ *H04L 69/324* (2013.01); *H04L 1/005* (2013.01); *H04L 1/007* (2013.01); *H04L 1/0041* (2013.01);
(Continued)

(58) Field of Classification Search
CPC ..... H04L 69/324; H04L 1/0041; H04L 1/005; H04L 1/0057; H04L 1/0058; H04L 1/007;
(Continued)

(56) References Cited

U.S. PATENT DOCUMENTS

2004/0014482 A1   1/2004  Kwak et al.
2005/0159944 A1*  7/2005  Beerends ............... G10L 25/69
                                            704/E19.002
(Continued)

FOREIGN PATENT DOCUMENTS

EP    2 219 313 A1   8/2010
EP    2 487 901 A2   8/2012
(Continued)

OTHER PUBLICATIONS

International Search Report dated Apr. 19, 2016, in corresponding International Application No. PCT/KR2016/000152 (15 pages in English).
(Continued)

*Primary Examiner* — Atique Ahmed
(74) *Attorney, Agent, or Firm* — NSIP Law

(57) ABSTRACT

An apparatus and method for broadcast signal frame using layered division multiplexing are disclosed. An apparatus for generating broadcast signal frame according to an embodiment of the present invention includes a combiner configured to generate a multiplexed signal by combining a core layer signal and an enhanced layer signal at different power levels; a power normalizer configured to reduce the power of the multiplexed signal to a power level correspond-
(Continued)

ing to the core layer signal; a time interleaver configured to generate a time-interleaved signal by performing interleaving that is applied to both the core layer signal and the enhanced layer signal; and a frame builder configured to generate a broadcast signal frame including a preamble for signaling time interleaver information shared by the core layer signal and the enhanced layer signal, using the time-interleaved signal.

4 Claims, 17 Drawing Sheets

Related U.S. Application Data continuation of application No. 15/541,604, filed as application No. PCT/KR2016/000152 on Jan. 7, 2016, now Pat. No. 10,652,369.

(51) Int. Cl.
    *H04L 1/00*          (2006.01)
    *H04L 69/323*      (2022.01)
    *H04H 60/07*       (2008.01)

(52) U.S. Cl.
    CPC .......... *H04L 1/0057* (2013.01); *H04L 1/0058* (2013.01); *H04L 1/0071* (2013.01); *H04L 5/0044* (2013.01); *H04L 69/323* (2013.01); *H04H 60/07* (2013.01); *H04L 5/0007* (2013.01); *Y02D 30/70* (2020.08)

(58) Field of Classification Search
    CPC ... H04L 1/0071; H04L 5/0044; H04L 69/323; H04L 5/0007; H04H 60/07; Y02D 30/70
    See application file for complete search history.

(56) References Cited

U.S. PATENT DOCUMENTS

| | | | | |
|---|---|---|---|---|
| 2007/0165566 | A1* | 7/2007 | Khan | H04L 1/0041 370/329 |
| 2007/0299660 | A1* | 12/2007 | Yoshida | G10L 19/012 704/220 |
| 2010/0046675 | A1 | 2/2010 | Collins et al. | |
| 2011/0039595 | A1 | 2/2011 | Luo et al. | |
| 2011/0222462 | A1 | 9/2011 | Ho et al. | |
| 2011/0286535 | A1 | 11/2011 | Ko et al. | |
| 2012/0076127 | A1* | 3/2012 | Mourad | H04L 5/0053 370/345 |
| 2012/0076204 | A1* | 3/2012 | Raveendran | H04N 21/631 375/E7.021 |
| 2012/0092452 | A1 | 4/2012 | Tourapis et al. | |
| 2012/0106482 | A1 | 5/2012 | Pajukoski et al. | |
| 2012/0323582 | A1 | 12/2012 | Peng et al. | |
| 2013/0219431 | A1* | 8/2013 | Hong | H04L 27/2601 725/54 |
| 2013/0343468 | A1* | 12/2013 | Ko | H04N 21/435 375/240.25 |
| 2014/0185515 | A1 | 7/2014 | Hong et al. | |
| 2015/0078477 | A1* | 3/2015 | Hong | H04L 5/0025 375/295 |
| 2015/0341053 | A1 | 11/2015 | Kim et al. | |
| 2016/0044309 | A1* | 2/2016 | Choi | H04N 19/33 375/240.12 |
| 2016/0050423 | A1* | 2/2016 | Alshina | H04N 19/154 375/240.12 |
| 2016/0056932 | A1 | 2/2016 | Kusunoki | |
| 2016/0119807 | A1* | 4/2016 | Sun | H04L 5/0091 370/252 |
| 2016/0173233 | A1 | 6/2016 | Loghin et al. | |
| 2016/0197759 | A1* | 7/2016 | Baek | H04L 5/0007 375/340 |
| 2020/0236202 | A1 | 7/2020 | Lee et al. | |

FOREIGN PATENT DOCUMENTS

| | | |
|---|---|---|
| EP | 2 566 156 A2 | 3/2013 |
| KR | 10-2362788 B1 | 2/2022 |
| WO | WO 2011/043618 A2 | 4/2011 |
| WO | WO 2011/136574 A2 | 11/2011 |

OTHER PUBLICATIONS

Montalban, Jon, et al. "Cloud transmission: System performance and application scenarios." *IEEE Transactions on Broadcasting* vol. 60. Issue 2 (2014). pp. 170-184.

* cited by examiner

BROADCASTING SIGNAL FRAME GENERATION APPARATUS AND METHOD USING LAYERED DIVISIONAL MULTIPLEXING

CROSS-REFERENCE TO RELATED APPLICATIONS

This application is a Continuation Application of U.S. patent application Ser. No. 16/840,565, filed on Apr. 6, 2020, which is a Continuation Application of U.S. patent application Ser. No. 15/541,604, filed on Jul. 5, 2017, which is a National Phase entry of PCT Application No. PCT/KR2016/000152, filed on Jan. 7, 2016, which claims priority under 35 U.S. C. § 119(e), 120 and 365(c) to Korean Patent Application No. 10-2015-0002588, filed on Jan. 8, 2015 and Korean Patent Application No. 10-2016-0001735, filed on Jan. 6, 2016, the entire disclosures of which are incorporated herein by reference for all purposes.

TECHNICAL FIELD

The present invention relates to broadcast signal transmission/reception technology that is used in a broadcasting system and, more particularly, to a broadcast signal transmission/reception system that multiplexes/demultiplexes and then transmits/receives two or more signals.

BACKGROUND ART

Bit-Interleaved Coded Modulation (BICM) is bandwidth-efficient transmission technology, and is implemented in such a manner that an error-correction coder, a bit-by-bit interleaver and a high-order modulator are combined with one another.

BICM can provide excellent performance using a simple structure because it uses a low-density parity check (LDPC) coder or a Turbo coder as the error-correction coder. Furthermore, BICM can provide high-level flexibility because it can select modulation order and the length and code rate of an error correction code in various forms. Due to these advantages, BICM has been used in broadcasting standards, such as DVB-T2 and DVB-NGH, and has a strong possibility of being used in other next-generation broadcasting systems.

To support multiple services at the same time, multiplexing, i.e., the process of mixing a plurality of signals, is required. Of multiplexing techniques, currently widely used techniques include Time Division Multiplexing (TDM) adapted to divide and use time resources and Frequency Division Multiplexing (FDM) adapted to divide and use frequency resources. That is, TDM is a method of assigning time segments to respective services, and FDM is a technique for assigning frequency resource segments to respective services and then using them. Recently, there is an urgent need for new multiplexing technology that is applicable to a next generation broadcasting system and provides greater flexibility and performance than TDM and FDM.

DISCLOSURE

Technical Problem

An object of the present invention is to provide a broadcast signal frame structure in which new signal multiplexing technologies capable of providing greater flexibility and performance than TDM and FDM are applied.

Furthermore, an object of the present invention is to enable each service to use 100% of time and frequency resources while supporting multiple services in a next generation broadcasting system at the same time.

Furthermore, an object of the present invention is to efficiently multiplex/demultiplex signals corresponding to two or more layers by combining the signals at respective different power levels.

Furthermore, an object of the present invention is to efficiently signaling layers which are combined at power levels different each other and Physical Layer Pipes (PLPs).

Technical Solution

In order to accomplish the above objects, the present invention provides an apparatus for generating broadcast signal frame, including: a combiner configured to generate a multiplexed signal by combining a core layer signal and an enhanced layer signal at different power levels; a power normalizer configured to reduce the power of the multiplexed signal to a power level corresponding to the core layer signal; a time interleaver configured to generate a time-interleaved signal by performing interleaving that is applied to both the core layer signal and the enhanced layer signal; and a frame builder configured to generate a broadcast signal frame including a preamble for signaling time interleaver information shared by the core layer signal and the enhanced layer signal, using the time-interleaved signal.

In this case, the frame builder may include a bootstrap generator configured to generate a bootstrap; a preamble generator configured to generate the preamble; and a superimposed payload generator configured to generate a superimposed payload corresponding to the time-interleaved signal.

In this case, the preamble may include a PLP identification information for identifying Physical Layer Pipes (PLPs); and a layer identification information for identifying layers corresponding to division of layers.

In this case, the PLP identification information and the layer identification information may be included in the preamble as fields different from each other.

In this case, the time interleaver information may be included in the preamble for each of the Physical Layer Pipes (PLPs) without checking a condition of a conditional statement corresponding to the layer identification information.

In this case, the apparatus may further include an injection level controller configured to generate a power-reduced enhanced layer signal by reducing the power of the enhanced layer signal. In this case, the combiner may generate the multiplexed signal by combining the core layer signal and the power-reduced enhanced layer signal.

In this case, the preamble may selectively include an injection level information corresponding to the injection level controller for each of the Physical Layer Pipes (PLPs) based on a result of comparing the layer identification information with a predetermined value.

In this case, the apparatus may further include: a core layer Bit-Interleaved Coded Modulation (BICM) unit configured to correspond to the core layer signal; and an enhanced layer BICM unit configured to perform Bit-Interleaved Coded Modulation (BICM) encoding different from that of the core layer BICM unit.

In this case, the power normalizer may correspond to a normalizing factor, and may reduce the power of the multiplexed signal by a level by which the power has been increased by the combiner.

In this case, the injection level controller may correspond to a scaling factor. In this case, each of the normalizing factor and the scaling factor may be a value that is larger than 0 and smaller than 1, the scaling factor may decrease as a reduction in power corresponding to the injection level controller becomes larger, and the normalizing factor may increase as a reduction in power corresponding to the injection level controller becomes larger.

In this case, the enhanced layer signal may correspond to enhanced layer data that is restored based on cancellation corresponding to the restoration of core layer data corresponding to the core layer signal.

In this case, the combiner may combine one or more extension layer signals, having lower power levels than the core layer signal and the enhanced layer signal, with the core layer signal and the enhanced layer signal.

Furthermore, an embodiment of the present invention provides a method of generating broadcast signal frame, including: generating a multiplexed signal by combining a core layer signal and an enhanced layer signal at different power levels; reducing the power of the multiplexed signal to a power level corresponding to the core layer signal; generating a time-interleaved signal by performing interleaving that is applied to both the core layer signal and the enhanced layer signal; and generating a broadcast signal frame including a preamble for signaling time interleaver information shared by the core layer signal and the enhanced layer signal, using the time-interleaved signal.

In this case, the generating the broadcast signal frame may include generating a bootstrap; generating the preamble; and generating a super-imposed payload corresponding to the time-interleaved signal.

In this case, the preamble may include a PLP identification information for identifying Physical Layer Pipes (PLPs); and a layer identification information for identifying layers corresponding to division of layers.

In this case, the PLP identification information and the layer identification information may be included in the preamble as fields different from each other.

In this case, the time interleaver information may be included in the preamble for each of the Physical Layer Pipes (PLPs) without checking a condition of a conditional statement corresponding to the layer identification information.

In this case, the method may further include generating a power-reduced enhanced layer signal by reducing the power of the enhanced layer signal. In this case, the combining may include generating a multiplexed signal by combining the core layer signal and the power-reduced enhanced layer signal.

In this case, the preamble may selectively include an injection level information corresponding to the injection level controller for each of the Physical Layer Pipes (PLPs) based on a result of comparing the layer identification information with a predetermined value.

Advantageous Effects

According to the present invention, a frame structure in which new signal multiplexing technologies capable of providing greater flexibility and performance than TDM and FDM is provided.

Furthermore, according to the present invention, multiple services can be supported in a next generation broadcasting system at the same time, and also each of the services can use 100% of time and frequency resources.

Furthermore, according to the present invention, signals corresponding to two or more layers can be efficiently multiplexed/demultiplexed by combining the signals at respective different power levels.

Furthermore, according to the present invention, layers which are combined at power levels different each other and Physical Layer Pipes (PLPs) are efficiently signaled.

MODE FOR INVENTION

Figure 1:
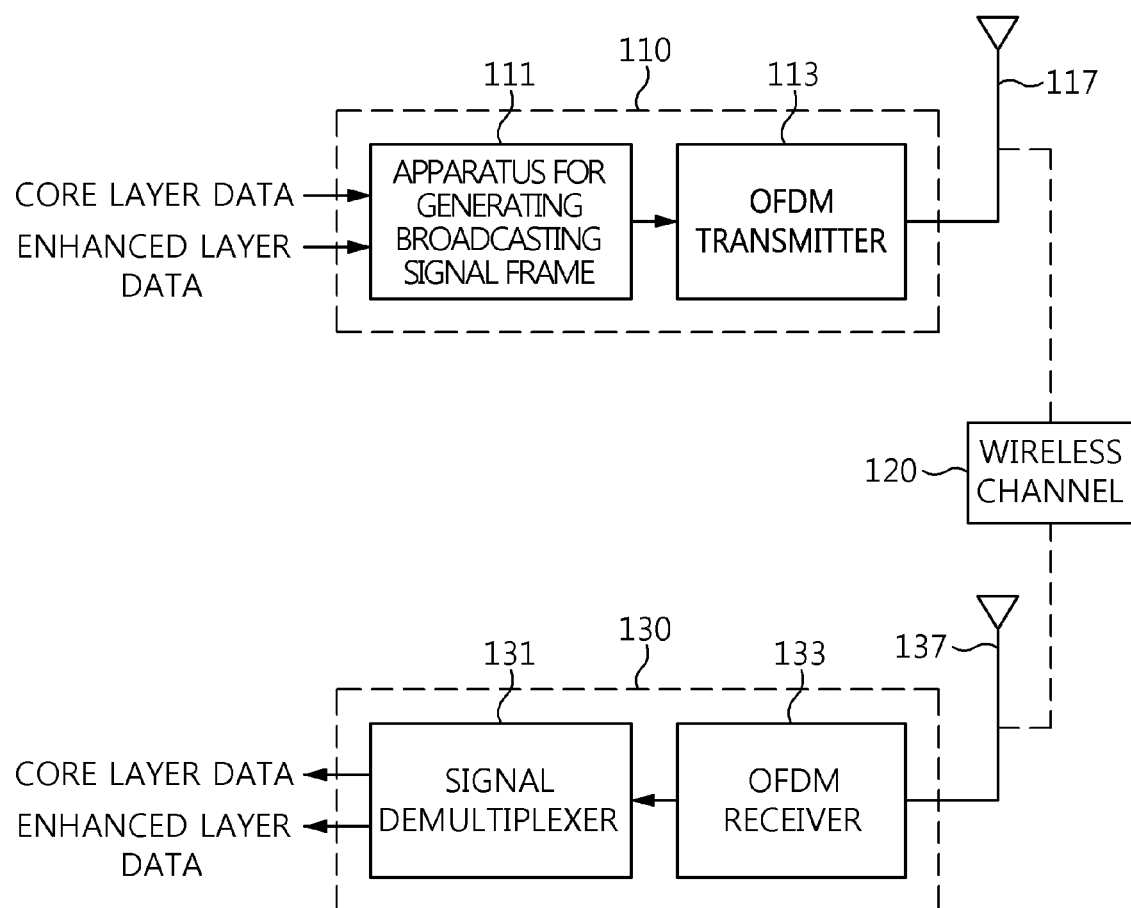
FIG. 1 is a block diagram showing a broadcast signal transmission/reception system according to an embodiment of the present invention.

The present invention will be described in detail below with reference to the accompanying drawings. In the description, redundant descriptions and descriptions of well-known functions and configurations that have been deemed to make the gist of the present invention unnecessarily obscure will be omitted below. The embodiments of the present invention are provided to fully describe the present invention to persons having ordinary knowledge in the art to which the present invention pertains. Accordingly, the shapes, sizes, etc. of components in the drawings may be exaggerated to make the description obvious.

Preferred embodiments of the present invention are described in detail below with reference to the accompanying drawings.

FIG. 1 is a block diagram showing a broadcast signal transmission/reception system according to an embodiment of the present invention.

Referring to FIG. 1, a broadcast signal transmission/reception system according to the embodiment of the present invention includes a broadcast signal transmission apparatus 110, a wireless channel 120, and a broadcast signal reception apparatus 130.

The broadcast signal transmission apparatus 110 includes an apparatus for generating broadcast signal frame 111 which generate the broadcast signal frame by multiplexing core layer data and enhanced layer data, and an OFDM transmitter 113.

The apparatus 111 combines a core layer signal corresponding to core layer data and an enhanced layer signal corresponding to enhanced layer data at different power levels, and generates a multiplexed signal by performing interleaving that is applied to both the core layer signal and the enhanced layer signal. In this case, the apparatus 111 may generate a broadcast signal frame including a bootstrap and a preamble using a time-interleaved signal. In this case, the broadcast signal frame may be an ATSC 3.0 frame.

The OFDM transmitter 113 transmits the multiplexed signal using an OFDM communication method via an antenna 117, thereby allowing the transmitted OFDM signal to be received via the antenna 137 of the broadcast signal reception apparatus 130 over the wireless channel 120.

The broadcast signal reception apparatus 130 includes an OFDM receiver 133 and a signal demultiplexer 131. When the signal transmitted over the wireless channel 120 is received via the antenna 137, the OFDM receiver 133 receives an OFDM signal via synchronization, channel estimation and equalization.

In this case, the OFDM receiver 133 may detect and demodulate the bootstrap from the OFDM signal, demodulate the preamble using information included in the bootstrap, and demodulate the super-imposed payload using information included in the preamble.

The signal demultiplexer 131 restores the core layer data from the signal (super-imposed payload) received via the OFDM receiver 133 first, and then restores the enhanced layer data via cancellation corresponding to the restored core layer data. In this case, the signal demultiplexer 131 may generate a broadcast signal frame first, may restore the bootstrap, may restore the preamble using the information included in the bootstrap, and may use the signaling information included in the preamble for the restoration of a data signal. In this case, the signaling information may be L1 signaling information and may include injection level information, normalizing factor information, etc.

In this case, the preamble may include a PLP identification information for identifying Physical Layer Pipes (PLPs); and a layer identification information for identifying layers corresponding to division of layers.

In this case, the PLP identification information and the layer identification information may be included in the preamble as fields different from each other.

In this case, the time interleaver information may be included in the preamble for each of the Physical Layer Pipes (PLPs) without checking a condition of a conditional statement corresponding to the layer identification information.

In this case, the preamble may selectively include an injection level information corresponding to the injection level controller for each of the Physical Layer Pipes (PLPs) based on a result of comparing the layer identification information with a predetermined value.

As will be described in detail later, the apparatus 111 shown in FIG. 1 may include a combiner configured to generate a multiplexed signal by combining a core layer signal and an enhanced layer signal at different power levels; a power normalizer configured to reduce the power of the multiplexed signal to a power level corresponding to the core layer signal; a time interleaver configured to generate a time-interleaved signal by performing interleaving that is applied to both the core layer signal and the enhanced layer signal; and a frame builder configured to generate a broadcast signal frame including a preamble for signaling time interleaver information shared by the core layer signal and the enhanced layer signal, using the time-interleaved signal.

In this case, the broadcast signal transmission apparatus 110 shown in FIG. 1 may be viewed as including: a combiner configured to generate a multiplexed signal by combining a core layer signal and an enhanced layer signal at different power levels; a power normalizer configured to reduce the power of the multiplexed signal to a power level corresponding to the core layer signal; a time interleaver configured to generate a time-interleaved signal by performing interleaving that is applied to both the core layer signal and the enhanced layer signal; a frame builder configured to generate a broadcast signal frame including a preamble for signaling time interleaver information shared by the core layer signal and the enhanced layer signal, using the time-interleaved signal; and an OFDM transmitter configured to transmit the broadcast signal frame using OFDM communication scheme through an antenna.

As will be described in detail later, the signal demultiplexer shown in FIG. 1 may include a time deinterleaver configured to generate a time-deinterleaved signal by applying time deinterleaving to a received signal corresponding to a broadcast signal frame; a de-normalizer configured to increase the power of the received signal or the time-deinterleaved signal by a level corresponding to a reduction in power by the power normalizer of the transmitter; a core layer BICM decoder configured to restore core layer data from the signal power-adjusted by the de-normalizer; an enhanced layer symbol extractor configured to extract an enhanced layer signal by performing cancellation corresponding to the core layer data on the signal power-adjusted by the de-normalizer using the output signal of the core layer FEC decoder of the core layer BICM decoder; a de-injection level controller configured to increase the power of the enhanced layer signal by a level corresponding to a reduction in power by the injection level controller of the transmitter; and an enhanced layer BICM decoder configured to restore enhanced layer data using the output signal of the de-injection level controller. In this case, the broadcast signal reception apparatus 130 shown in FIG. 1 may be viewed as including: an OFDM receiver configured to generate a received signal by performing any one or more of synchronization, channel estimation and equalization on a transmitted signal corresponding to a broadcast signal frame; a time deinterleaver configured to generate a time-deinterleaved signal by applying time deinterleaving to the received signal; a de-normalizer configured to increase the power of the received signal or the time-deinterleaved signal by a level corresponding to a reduction in power by the power normalizer of the transmitter; a core layer BICM decoder configured to restore core layer data from the signal power-adjusted by the de-normalizer; an enhanced layer symbol extractor configured to extract an enhanced layer signal by performing cancellation corresponding to the core layer data on the signal power-adjusted by the de-normalizer using the output signal of the core layer FEC decoder of the core layer BICM decoder; a de-injection level controller configured to increase the power of the enhanced layer signal by a level corresponding to a reduction in power by the injection level controller of the transmitter; and an enhanced layer BICM decoder configured to restore enhanced layer data using the output signal of the de-injection level controller.

Although not explicitly shown in FIG. 1, a broadcast signal transmission/reception system according to an embodiment of the present invention may multiplex/demultiplex one or more pieces of extension layer data in addition to the core layer data and the enhanced layer data. In this case, the extension layer data may be multiplexed at a power level lower than that of the core layer data and the enhanced layer data. Furthermore, when two or more extension layers are included, the injection power level of a second extension layer may be lower than the injection power level of a first extension layer, and the injection power level of a third extension layer may be lower than the injection power level of the second extension layer.

Figure 2:
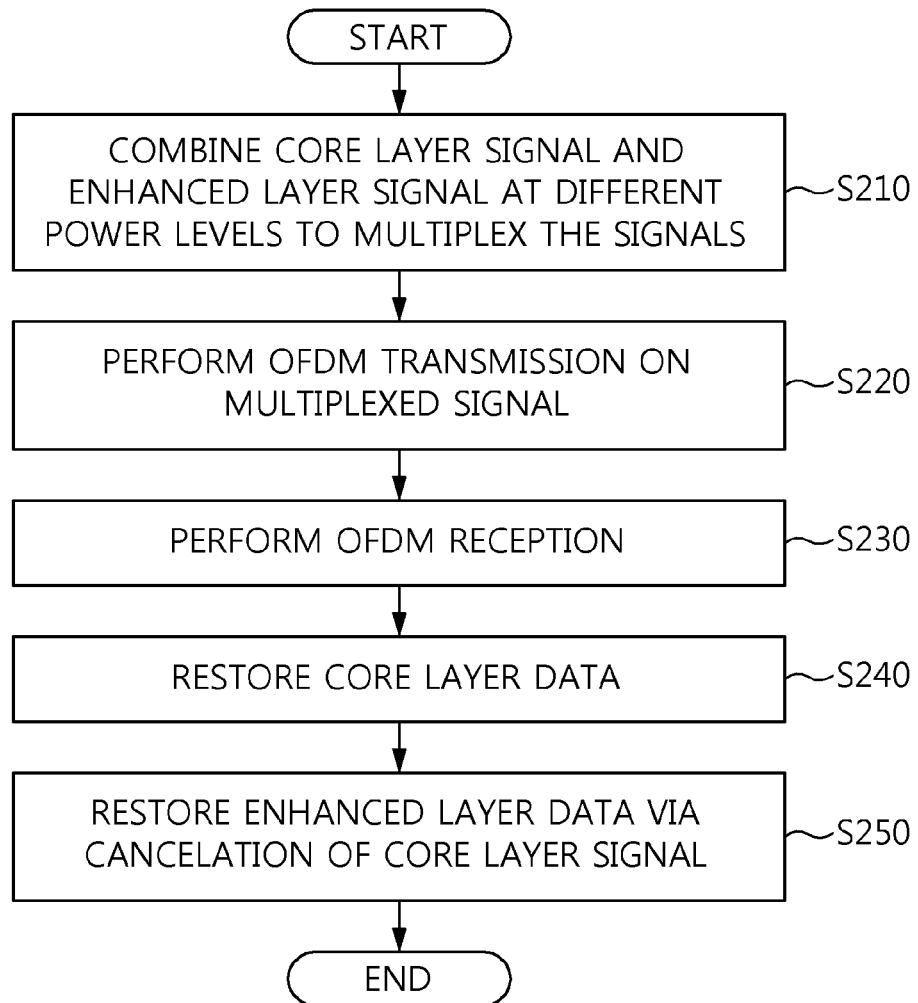
FIG. 2 is an operation flowchart showing a broadcast signal transmission/reception method according to an embodiment of the present invention.

FIG. 2 is an operation flowchart showing a broadcast signal transmission/reception method according to an embodiment of the present invention.

Referring to FIG. 2, in the broadcast signal transmission/reception method according to the embodiment of the present invention, a core layer signal and an enhanced layer signal are combined at different power levels and then multiplexed to generate a broadcast signal frame including a preamble for signaling time interleaver information shared by the core layer signal and the enhanced layer signal at step S210.

In this case, the broadcast signal frame generated at step S210 may include the bootstrap, the preamble and a super-imposed payload. In this case, at least of the bootstrap and the preamble may include L1 signaling information. In this case, the L1 signaling information may include injection level information and normalizing factor information.

In this case, the preamble may include a PLP identification information for identifying Physical Layer Pipes (PLPs); and a layer identification information for identifying layers corresponding to division of layers.

In this case, the PLP identification information and the layer identification information may be included in the preamble as fields different from each other.

In this case, the time interleaver information may be included in the preamble for each of the Physical Layer Pipes (PLPs) without checking a condition of a conditional statement corresponding to the layer identification information.

In this case, the preamble may selectively include an injection level information corresponding to the injection level controller for each of the Physical Layer Pipes (PLPs) based on a result of comparing the layer identification information with a predetermined value.

Furthermore, in the broadcast signal transmission/reception method according to the embodiment of the present invention, the broadcast signal frame is OFDM transmitted at step S220.

Furthermore, in the broadcast signal transmission/reception method according to the embodiment of the present invention, the transmitted signal is OFDM received at step S230.

In this case, at step S230, synchronization, channel estimation and equalization may be performed.

In this case, the bootstrap may be restored, the preamble may be restored using a signal included in the restored bootstrap, and the data signal may be restored using the signaling information included in the preamble at step S230.

Furthermore, in the broadcast signal transmission/reception method according to the embodiment of the present invention, core layer data is restored from the received signal at step S240.

Furthermore, in the broadcast signal transmission/reception method according to the embodiment of the present invention, enhanced layer data is restored via the cancellation of the core layer signal at step S250.

In particular, steps S240 and S250 shown in FIG. 2 may correspond to demultiplexing operations corresponding to step S210.

As will be described in detail later, step S210 shown in FIG. 2 may include generating a multiplexed signal by combining a core layer signal and an enhanced layer signal at different power levels; reducing the power of the multiplexed signal to a power level corresponding to the core layer signal; generating a time-interleaved signal by performing interleaving that is applied to both the core layer signal and the enhanced layer signal; and generating a broadcast signal frame including a preamble for signaling time interleaver information shared by the core layer signal and the enhanced layer signal, using the time-interleaved signal.

In this case, the broadcast signal transmission method of steps S210 and S220 may be viewed as including generating a multiplexed signal by combining a core layer signal and an enhanced layer signal at different power levels; reducing the power of the multiplexed signal to a power level corresponding to the core layer signal; generating a time-interleaved signal by performing interleaving that is applied to both the core layer signal and the enhanced layer signal; generating a broadcast signal frame including a preamble for signaling time interleaver information shared by the core layer signal and the enhanced layer signal, using the time-interleaved signal; and transmitting the broadcast signal frame using an OFDM communication scheme through an antenna.

As will be described in detail later, steps S240 and S250 shown in FIG. 2 may include generating a time-deinterleaved signal by applying time deinterleaving to a received signal corresponding to a broadcast signal frame; increasing the power of the received signal or the time-deinterleaved signal by a level corresponding to a reduction in power by the power normalizer of the transmitter; restoring core layer data from the power-adjusted signal; extracting an enhanced layer signal by performing cancellation corresponding to the core layer data on the power-adjusted signal; increasing the power of the enhanced layer signal by a level corresponding to a reduction in power by the injection level controller of the transmitter; and restoring enhanced layer data using the power-adjusted enhanced signal. In this case, a broadcast signal reception method according to an embodiment of the present invention may be viewed as including: generating a received signal by performing any one or more of synchronization, channel estimation and equalization on a transmitted signal corresponding to a broadcast signal frame; generating a time-deinterleaved signal by applying time deinterleaving to the received signal; increasing the power of the received signal or the time-deinterleaved signal by a level corresponding to a reduction in power by the power normalizer of the transmitter; restoring core layer data from the power-adjusted signal; extracting an enhanced layer signal by performing cancellation corresponding to the core layer data on the power-adjusted signal; increasing the power of the enhanced layer signal by a level corresponding to a reduction in power by the injection level controller of the transmitter; and restoring enhanced layer data using the power-adjusted enhanced layer signal.

Figure 3:
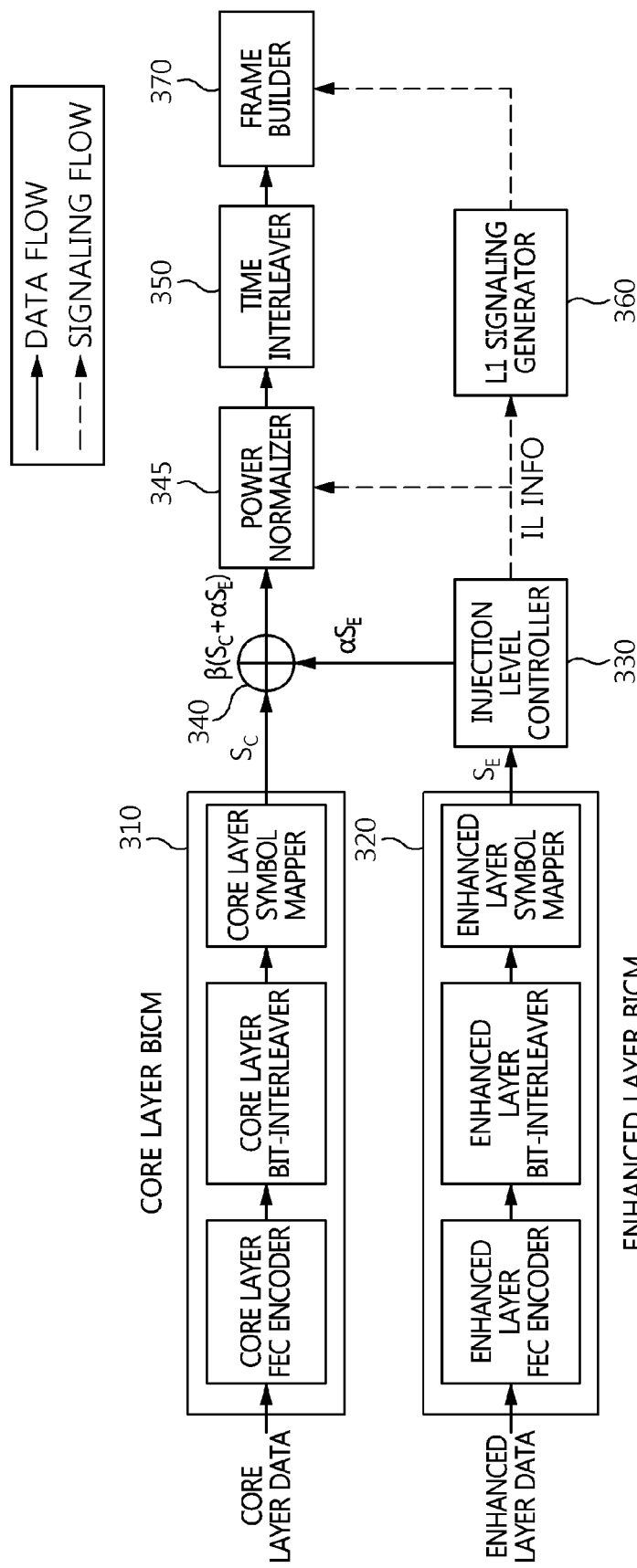
FIG. 3 is a block diagram showing an example of the apparatus for generating broadcast signal frame in FIG. 1.

FIG. 3 is a block diagram showing an example of the apparatus for generating broadcast signal frame in FIG. 1.

Referring to FIG. 3, the apparatus for generating broadcast signal frame according to an embodiment of the present invention may include a core layer BICM unit 310, an enhanced layer BICM unit 320, an injection level controller 330, a combiner 340, a power normalizer 345, and a time interleaver 350, a signaling generation unit 360, and a frame builder 370.

Generally, a BICM device includes an error correction encoder, a bit interleaver, and a symbol mapper. Each of the core layer BICM unit 310 and the enhanced layer BICM unit 320 shown in FIG. 3 may include an error correction encoder, a bit interleaver, and a symbol mapper. In particular, each of the error correction encoders (the core layer FEC encoder, and the enhanced layer FEC encoder) shown in FIG. 3 may be formed by connecting a BCH encoder and an LDPC encoder in series. In this case, the input of the error correction encoder is input to the BCH encoder, the output of the BCH encoder is input to the LDPC encoder, and the output of the LDPC encoder may be the output of the error correction encoder.

As shown in FIG. 3, core layer data and enhanced layer data pass through respective different BICM units, and are then combined by the combiner 340. That is, the term "Layered Division Multiplexing (LDM)" used herein may refer to combining the pieces of data of a plurality of layers into a single piece of data using differences in power and then transmitting the combined data.

That is, the core layer data passes through the core layer BICM unit 310, the enhanced layer data passes through the enhanced layer BICM unit 320 and then the injection level controller 330, and the core layer data and the enhanced layer data are combined by the combiner 340. In this case, the enhanced layer BICM unit 320 may perform BICM encoding different from that of the core layer BICM unit 310. That is, the enhanced layer BICM unit 320 may perform higher bit rate error correction encoding or symbol mapping than the core layer BICM unit 310. Furthermore, the enhanced layer BICM unit 320 may perform less robust error correction encoding or symbol mapping than the core layer BICM unit 310.

For example, the core layer error correction encoder may exhibit a lower bit rate than the enhanced layer error correction encoder. In this case, the enhanced layer symbol mapper may be less robust than the core layer symbol mapper.

The combiner 340 may be viewed as functioning to combine the core layer signal and the enhanced layer signal at different power levels. In an embodiment, power level adjustment may be performed on the core layer signal rather than the enhanced layer signal. In this case, the power of the core layer signal may be adjusted to be higher than the power of the enhanced layer signal.

The core layer data may use forward error correction (FEC) code having a low code rate in order to perform robust reception, while the enhanced layer data may use FEC code having a high code rate in order to achieve a high data transmission rate.

That is, the core layer data may have a broader coverage than the enhanced layer data in the same reception environment.

The enhanced layer data having passed through the enhanced layer BICM unit 320 is adjusted in gain (or power) by the injection level controller 330, and is combined with the core layer data by the combiner 340.

That is, the injection level controller 330 generates a power-reduced enhanced layer signal by reducing the power of the enhanced layer signal. In this case, the magnitude of the signal adjusted by the injection level controller 330 may be determined based on an injection level. In this case, an injection level in the case where signal B is inserted into signal A may be defined by Equation 1 below:

$$\text{Injection level (dB)} = -10\log_{10}\left(\frac{\text{Signal power of } B}{\text{Signal power of } A}\right) \quad (1)$$

For example, assuming that the injection level is 3 dB when the enhanced layer signal is inserted into the core layer signal, Equation 1 means that the enhanced layer signal has power corresponding to half of the power of the core layer signal.

In this case, the injection level controller 330 may adjust the power level of the enhanced layer signal from 0 dB to 25.0 dB in steps of 0.5 dB or 1 dB.

In general, transmission power that is assigned to the core layer is higher than transmission power that is assigned to the enhanced layer, which enables the receiver to decode core layer data first.

In this case, the combiner 340 may be viewed as generating a multiplexed signal by combining the core layer signal with the power-reduced enhanced layer signal.

The signal obtained by the combination of the combiner 340 is provided to the power normalizer 345 so that the power of the signal can be reduced by a power level corresponding to an increase in power caused by the combination of the core layer signal and the enhanced layer signal, and then power adjustment is performed. That is, the power normalizer 345 reduces the power of the signal, obtained by the multiplexing of the combiner 340, to a power level corresponding to the core layer signal. Since the level of the combined signal is higher than the level of one layer signal, the power normalizing of the power normalizer 345 is required in order to prevent amplitude clipping, etc. in the remaining portion of a broadcast signal transmission/reception system.

In this case, the power normalizer 345 may adjust the magnitude of the combined signal to an appropriate value by multiplying the magnitude of the combined signal by the normalizing factor of Equation 2 below. Injection level information used to calculate Equation 2 below may be transferred to the power normalizer 345 via a signaling flow:

$$\text{Normalizing factor} = (\sqrt{(1+10^{-Injectionlevel(dB)/10})})^{-1} \quad (2)$$

Assuming that the power levels of the core layer signal and the enhanced layer signal are normalized to 1 when an enhanced layer signal $S_E$ is injected into a core layer signal $S_C$ at a preset injection level, a combined signal may be expressed by $S_C+\alpha S_E$.

In this case, a is scaling factors corresponding to various injection levels. That is, the injection level controller 330 may correspond to the scaling factor.

For example, when the injection level of an enhanced layer is 3 dB, a combined signal may be expressed by $$S_C + \sqrt{\frac{1}{2}} S_E.$$

Since the power of a combined signal (a multiplexed signal) increases compared to a core layer signal, the power normalizer 345 needs to mitigate the increase in power.

The output of the power normalizer 345 may be expressed by $\beta(S_C+\alpha S_E)$.

In this case, $\beta$ is normalizing factors based on various injection levels of the enhanced layer.

When the injection level of the enhanced layer is 3 dB, the power of the combined signal is increased by 50% compared to that of the core layer signal. Accordingly, the output of the power normalizer 345 may be expressed by $$\sqrt{\frac{2}{3}}\left(S_C + \sqrt{\frac{1}{2}} S_E\right).$$

Table 1 below lists scaling factors α and normalizing factors β for various injection levels (CL: Core Layer, EL: Enhanced Layer). The relationships among the injection level, the scaling factor α and the normalizing factor β may be defined by Equation 3 below:

$$\begin{cases} \alpha = 10^{\left(\frac{-Injection\ level}{20}\right)} \\ \beta = \frac{1}{\sqrt{1+\alpha^2}} \end{cases} \quad (3)$$

TABLE 1

| EL Injection level relative to CL | Scaling factor α | Normalizing factor β |
|---|---|---|
| 3.0 dB | 0.7079458 | 0.8161736 |
| 3.5 dB | 0.6683439 | 0.8314061 |
| 4.0 dB | 0.6309573 | 0.8457262 |
| 4.5 dB | 0.5956621 | 0.8591327 |
| 5.0 dB | 0.5623413 | 0.8716346 |
| 5.5 dB | 0.5308844 | 0.8832495 |
| 6.0 dB | 0.5011872 | 0.8940022 |
| 6.5 dB | 0.4731513 | 0.9039241 |
| 7.0 dB | 0.4466836 | 0.9130512 |
| 7.5 dB | 0.4216965 | 0.9214231 |
| 8.0 dB | 0.3981072 | 0.9290819 |
| 8.5 dB | 0.3758374 | 0.9360712 |
| 9.0 dB | 0.3548134 | 0.9424353 |
| 9.5 dB | 0.3349654 | 0.9482180 |
| 10.0 dB | 0.3162278 | 0.9534626 |

That is, the power normalizer 345 corresponds to the normalizing factor, and reduces the power of the multiplexed signal by a level by which the combiner 340 has increased the power.

In this case, each of the normalizing factor and the scaling factor may be a rational number that is larger than 0 and smaller than 1.

In this case, the scaling factor may decrease as a reduction in power corresponding to the injection level controller 330 becomes larger, and the normalizing factor may increase as a reduction in power corresponding to the injection level controller 330 becomes larger.

The power normalized signal passes through the time interleaver 350 for distributing burst errors occurring over a channel.

In this case, the time interleaver 350 may be viewed as performing interleaving that is applied to both the core layer signal and the enhanced layer signal. That is, the core layer and the enhanced layer share the time interleaver, thereby preventing the unnecessary use of memory and also reducing latency at the receiver.

Although will be described later in greater detail, the enhanced layer signal may correspond to enhanced layer data restored based on cancellation corresponding to the restoration of core layer data corresponding to the core layer signal. The combiner 340 may combine one or more extension layer signals having power levels lower than those of the core layer signal and the enhanced layer signal with the core layer signal and the enhanced layer signal.

Meanwhile, L1 signaling information including injection level information is encoded by the signaling generation unit 360 including signaling-dedicated BICM. In this case, the signaling generation unit 360 may receive injection level information IL INFO from the injection level controller 330, and may generate an L1 signaling signal.

In L1 signaling, L1 refers to Layer-1 in the lowest layer of the ISO 7 layer model. In this case, the L1 signaling may be included in a preamble.

In general, the L1 signaling may include an FFT size, a guard interval size, etc., i.e., the important parameters of the OFDM transmitter, a channel code rate, modulation information, etc., i.e., BICM important parameters. This L1 signaling signal is combined with data signal into a broadcast signal frame.

The frame builder 370 generates a broadcast signal frame by combining the L1 signaling signal with a data signal. In this case, the frame builder 370 may generate the broadcast signal frame including a preamble for signaling time interleaver information shared by the core layer signal and the enhanced layer signal, using the time interleaved signal. In this case, the broadcast signal frame may further include a bootstrap.

In this case, the frame builder 370 may include a bootstrap generator configured to generate the bootstrap, a preamble generator configured to generate the preamble, and a superimposed payload generator configured to generate a superimposed payload corresponding to the time-interleaved signal.

In this case, the bootstrap may be shorter than the preamble, and have a fixed-length.

In this case, the bootstrap may include a symbol representing a structure of the preamble, the symbol corresponding to a fixed-length bit string representing a combination of a modulation scheme/code rate, a FFT size, a guard interval length and a pilot pattern of the preamble.

In this case, the symbol may correspond to a lookup table in which a preamble structure corresponding to a second FFT size is allocated prior to a preamble structure corresponding to a first FFT size, the second FFT size being less than the first FFT size when the modulation scheme/code rates are the same, and a preamble structure corresponding to a second guard interval length is allocated prior to a preamble structure corresponding to a first guard interval length, the second guard interval length being longer than the first guard interval length when the modulation scheme/ code rates are the same and the FFT sizes are the same.

The broadcast signal frame may be transmitted via the OFDM transmitter that is robust to a multi-path and the Doppler phenomenon. In this case, the OFDM transmitter may be viewed as being responsible for the transmission signal generation of the next generation broadcasting system.

In this case, the preamble may include a PLP identification information for identifying Physical Layer Pipes (PLPs); and a layer identification information for identifying layers corresponding to division of layers.

In this case, the PLP identification information and the layer identification information may be included in the preamble as fields different from each other.

In this case, the time interleaver information may be included in the preamble for each of the Physical Layer Pipes (PLPs) without checking a condition of a conditional statement corresponding to the layer identification information (j).

In this case, the preamble may selectively include an injection level information corresponding to the injection level controller for each of the Physical Layer Pipes (PLPs) based on a result of comparing (IF(j>0)) the layer identification information with a predetermined value.

Figure 4:
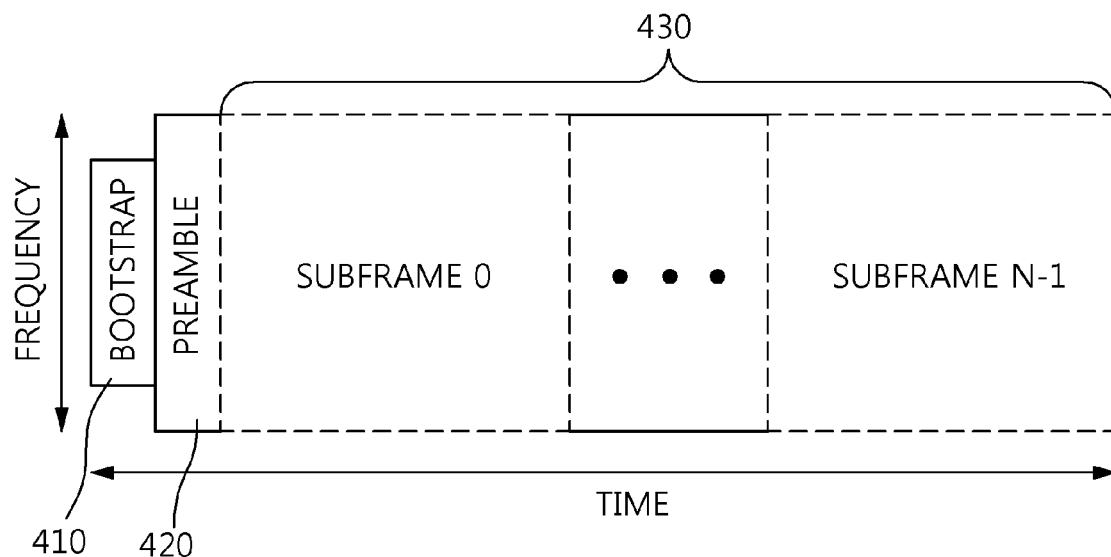
FIG. 4 is a diagram showing an example of the structure of a broadcast signal frame.

FIG. 4 is a diagram showing an example of the structure of a broadcast signal frame.

Referring to FIG. 4, a broadcast signal frame includes the bootstrap 410, the preamble 420 and the super-imposed payload 430.

The frame shown in FIG. 4, may be included in the super-frame.

In this case, the broadcast signal frame may include at least one of OFDM symbols. The broadcast signal frame may include a reference symbol or a pilot symbol.

The frame structure in which the Layered Division Multiplexing (LDM) is applied includes the bootstrap 410, the preamble 420 and the super-imposed payload 430 as shown in FIG. 4.

In this case, the bootstrap 410 and the preamble 420 may be seen as the two hierarchical preambles.

In this case, the bootstrap 410 may have a shorter length than the preamble 420 for the fast acquisition and detection. In this case, the bootstrap 410 may have a fixed-length. In this case, the bootstrap may include a fixed-length symbol. For example, the bootstrap 410 may consist of four OFDM symbols each of which has 0.5 ms length so that the bootstrap 410 may correspond to the fixed time length of 2 ms.

In this case, the bootstrap 410 may have a fixed bandwidth, and the preamble 420 and the super-imposed payload 430 may have a variable bandwidth wider than the bootstrap 410.

The preamble 420 may transmit detailed signaling information using a robust LDPC code. In this case, the length of the preamble 420 can be varied according to the signaling information.

In this case, both the bootstrap 410 and the payload 430 may be seen as a common signal which is shared by a plurality of layers.

The super-imposed payload 430 may correspond to a multiplexed signal of at least two layer signals. In this case, the super-imposed payload 430 may be generated by combining a core layer payload and an enhanced layer payload at different power levels. In this case, the core layer payload may include am in-band signaling section. In this case, the in-band signaling section may include signaling information for the enhanced layer service.

In this case, the bootstrap 410 may include a symbol representing a preamble structure.

In this case, the symbol which included in the bootstrap for representing the preamble structure may be set as shown in the Table 2 below.

TABLE 2

| preamble_structure | L1-Basic Mode | FFT Size | GI Length (samples) | Pilot Pattern (DX) |
|---|---|---|---|---|
| 0 | L1-Basic Mode 1 | 8192 | 2048 | 3 |
| 1 | L1-Basic Mode 1 | 8192 | 1536 | 4 |
| 2 | L1-Basic Mode 1 | 8192 | 1024 | 3 |
| 3 | L1-Basic Mode 1 | 8192 | 768 | 4 |
| 4 | L1-Basic Mode 1 | 16384 | 4096 | 3 |
| 5 | L1-Basic Mode 1 | 16384 | 3648 | 4 |
| 6 | L1-Basic Mode 1 | 16384 | 2432 | 3 |
| 7 | L1-Basic Mode 1 | 16384 | 1536 | 4 |
| 8 | L1-Basic Mode 1 | 16384 | 1024 | 6 |
| 9 | L1-Basic Mode 1 | 16384 | 768 | 8 |
| 10 | L1-Basic Mode 1 | 32768 | 4864 | 3 |
| 11 | L1-Basic Mode 1 | 32768 | 3648 | 3 |
| 12 | L1-Basic Mode 1 | 32768 | 3648 | 8 |
| 13 | L1-Basic Mode 1 | 32768 | 2432 | 6 |
| 14 | L1-Basic Mode 1 | 32768 | 1536 | 8 |
| 15 | L1-Basic Mode 1 | 32768 | 1024 | 12 |
| 16 | L1-Basic Mode 1 | 32768 | 768 | 16 |
| 17 | L1-Basic Mode 2 | 8192 | 2048 | 3 |
| 18 | L1-Basic Mode 2 | 8192 | 1536 | 4 |
| 19 | L1-Basic Mode 2 | 8192 | 1024 | 3 |
| 20 | L1-Basic Mode 2 | 8192 | 768 | 4 |
| 21 | L1-Basic Mode 2 | 16384 | 4096 | 3 |
| 22 | L1-Basic Mode 2 | 16384 | 3648 | 4 |
| 23 | L1-Basic Mode 2 | 16384 | 2432 | 3 |
| 24 | L1-Basic Mode 2 | 16384 | 1536 | 4 |
| 25 | L1-Basic Mode 2 | 16384 | 1024 | 6 |
| 26 | L1-Basic Mode 2 | 16384 | 768 | 8 |
| 27 | L1-Basic Mode 2 | 32768 | 4864 | 3 |
| 28 | L1-Basic Mode 2 | 32768 | 3648 | 3 |
| 29 | L1-Basic Mode 2 | 32768 | 3648 | 8 |
| 30 | L1-Basic Mode 2 | 32768 | 2432 | 6 |
| 31 | L1-Basic Mode 2 | 32768 | 1536 | 8 |
| 32 | L1-Basic Mode 2 | 32768 | 1024 | 12 |
| 33 | L1-Basic Mode 2 | 32768 | 768 | 16 |

TABLE 2-continued

| preamble_structure | L1-Basic Mode | FFT Size | GI Length (samples) | Pilot Pattern (DX) |
|---|---|---|---|---|
| 34 | L1-Basic Mode 3 | 8192 | 2048 | 3 |
| 35 | L1-Basic Mode 3 | 8192 | 1536 | 4 |
| 36 | L1-Basic Mode 3 | 8192 | 1024 | 3 |
| 37 | L1-Basic Mode 3 | 8192 | 768 | 4 |
| 38 | L1-Basic Mode 3 | 16384 | 4096 | 3 |
| 39 | L1-Basic Mode 3 | 16384 | 3648 | 4 |
| 40 | L1-Basic Mode 3 | 16384 | 2432 | 3 |
| 41 | L1-Basic Mode 3 | 16384 | 1536 | 4 |
| 42 | L1-Basic Mode 3 | 16384 | 1024 | 6 |
| 43 | L1-Basic Mode 3 | 16384 | 768 | 8 |
| 44 | L1-Basic Mode 3 | 32768 | 4864 | 3 |
| 45 | L1-Basic Mode 3 | 32768 | 3648 | 3 |
| 46 | L1-Basic Mode 3 | 32768 | 3648 | 8 |
| 47 | L1-Basic Mode 3 | 32768 | 2432 | 6 |
| 48 | L1-Basic Mode 3 | 32768 | 1536 | 8 |
| 49 | L1-Basic Mode 3 | 32768 | 1024 | 12 |
| 50 | L1-Basic Mode 3 | 32768 | 768 | 16 |
| 51 | L1-Basic Mode 4 | 8192 | 2048 | 3 |
| 52 | L1-Basic Mode 4 | 8192 | 1536 | 4 |
| 53 | L1-Basic Mode 4 | 8192 | 1024 | 3 |
| 54 | L1-Basic Mode 4 | 8192 | 768 | 4 |
| 55 | L1-Basic Mode 4 | 16384 | 4096 | 3 |
| 56 | L1-Basic Mode 4 | 16384 | 3648 | 4 |
| 57 | L1-Basic Mode 4 | 16384 | 2432 | 3 |
| 58 | L1-Basic Mode 4 | 16384 | 1536 | 4 |
| 59 | L1-Basic Mode 4 | 16384 | 1024 | 6 |
| 60 | L1-Basic Mode 4 | 16384 | 768 | 8 |
| 61 | L1-Basic Mode 4 | 32768 | 4864 | 3 |
| 62 | L1-Basic Mode 4 | 32768 | 3648 | 3 |
| 63 | L1-Basic Mode 4 | 32768 | 3648 | 8 |
| 64 | L1-Basic Mode 4 | 32768 | 2432 | 6 |
| 65 | L1-Basic Mode 4 | 32768 | 1536 | 8 |
| 66 | L1-Basic Mode 4 | 32768 | 1024 | 12 |
| 67 | L1-Basic Mode 4 | 32768 | 768 | 16 |
| 68 | L1-Basic Mode 5 | 8192 | 2048 | 3 |
| 69 | L1-Basic Mode 5 | 8192 | 1536 | 4 |
| 70 | L1-Basic Mode 5 | 8192 | 1024 | 3 |
| 71 | L1-Basic Mode 5 | 8192 | 768 | 4 |
| 72 | L1-Basic Mode 5 | 16384 | 4096 | 3 |
| 73 | L1-Basic Mode 5 | 16384 | 3648 | 4 |
| 74 | L1-Basic Mode 5 | 16384 | 2432 | 3 |
| 75 | L1-Basic Mode 5 | 16384 | 1536 | 4 |
| 76 | L1-Basic Mode 5 | 16384 | 1024 | 6 |
| 77 | L1-Basic Mode 5 | 16384 | 768 | 8 |
| 78 | L1-Basic Mode 5 | 32768 | 4864 | 3 |
| 79 | L1-Basic Mode 5 | 32768 | 3648 | 3 |
| 80 | L1-Basic Mode 5 | 32768 | 3648 | 8 |
| 81 | L1-Basic Mode 5 | 32768 | 2432 | 6 |
| 82 | L1-Basic Mode 5 | 32768 | 1536 | 8 |
| 83 | L1-Basic Mode 5 | 32768 | 1024 | 12 |
| 84 | L1-Basic Mode 5 | 32768 | 768 | 16 |
| 85 | L1-Basic Mode 6 | 8192 | 2048 | 3 |
| 86 | L1-Basic Mode 6 | 8192 | 1536 | 4 |
| 87 | L1-Basic Mode 6 | 8192 | 1024 | 3 |
| 88 | L1-Basic Mode 6 | 8192 | 768 | 4 |
| 89 | L1-Basic Mode 6 | 16384 | 4096 | 3 |
| 90 | L1-Basic Mode 6 | 16384 | 3648 | 4 |
| 91 | L1-Basic Mode 6 | 16384 | 2432 | 3 |
| 92 | L1-Basic Mode 6 | 16384 | 1536 | 4 |
| 93 | L1-Basic Mode 6 | 16384 | 1024 | 6 |
| 94 | L1-Basic Mode 6 | 16384 | 768 | 8 |
| 95 | L1-Basic Mode 6 | 32768 | 4864 | 3 |
| 96 | L1-Basic Mode 6 | 32768 | 3648 | 3 |
| 97 | L1-Basic Mode 6 | 32768 | 3648 | 8 |
| 98 | L1-Basic Mode 6 | 32768 | 2432 | 6 |
| 99 | L1-Basic Mode 6 | 32768 | 1536 | 8 |
| 100 | L1-Basic Mode 6 | 32768 | 1024 | 12 |
| 101 | L1-Basic Mode 6 | 32768 | 768 | 16 |
| 102 | L1-Basic Mode 7 | 8192 | 2048 | 3 |
| 103 | L1-Basic Mode 7 | 8192 | 1536 | 4 |
| 104 | L1-Basic Mode 7 | 8192 | 1024 | 3 |
| 105 | L1-Basic Mode 7 | 8192 | 768 | 4 |
| 106 | L1-Basic Mode 7 | 16384 | 4096 | 3 |
| 107 | L1-Basic Mode 7 | 16384 | 3648 | 4 |
| 108 | L1-Basic Mode 7 | 16384 | 2432 | 3 |
| 109 | L1-Basic Mode 7 | 16384 | 1536 | 4 |

TABLE 2-continued

| preamble_structure | L1-Basic Mode | FFT Size | GI Length (samples) | Pilot Pattern (DX) |
|---|---|---|---|---|
| 110 | L1-Basic Mode 7 | 16384 | 1024 | 6 |
| 111 | L1-Basic Mode 7 | 16384 | 768 | 8 |
| 112 | L1-Basic Mode 7 | 32768 | 4864 | 3 |
| 113 | L1-Basic Mode 7 | 32768 | 3648 | 3 |
| 114 | L1-Basic Mode 7 | 32768 | 3648 | 8 |
| 115 | L1-Basic Mode 7 | 32768 | 2432 | 6 |
| 116 | L1-Basic Mode 7 | 32768 | 1536 | 8 |
| 117 | L1-Basic Mode 7 | 32768 | 1024 | 12 |
| 118 | L1-Basic Mode 7 | 32768 | 768 | 16 |
| 119 | Reserved | Reserved | Reserved | Reserved |
| 120 | Reserved | Reserved | Reserved | Reserved |
| 121 | Reserved | Reserved | Reserved | Reserved |
| 122 | Reserved | Reserved | Reserved | Reserved |
| 123 | Reserved | Reserved | Reserved | Reserved |
| 124 | Reserved | Reserved | Reserved | Reserved |
| 125 | Reserved | Reserved | Reserved | Reserved |
| 126 | Reserved | Reserved | Reserved | Reserved |
| 127 | Reserved | Reserved | Reserved | Reserved |

For example, a fixed-length symbol of 7-bit may be assigned for representing the preamble structure shown in the Table 2.

The L1-Basic Mode 1, L1-Basic Mode 2 and L1-Basic Mode 3 in the Table 2 may correspond to QPSK and 3/15 LDPC.

The L1 Basic Mode 4 in the Table 2 may correspond to 16-NUC (Non Uniform Constellation) and 3/15 LDPC.

The L1 Basic Mode 5 in the Table 2 may correspond to 64-NUC (Non Uniform Constellation) and 3/15 LDPC.

The L1-Basic Mode 6 and L1-Basic Mode 7 in the Table 2 may correspond to 256-NUC (Non Uniform Constellation) and 3/15 LDPC. Hereafter, the modulation scheme/code rate represents a combination of a modulation scheme and a code rate such as QPSK and 3/15 LDPC.

The FFT size in the Table 2 may represent a size of Fast Fourier Transform.

The GI length in the Table 2 may represent the Guard Interval Length, may represent a length of the guard interval which is not data in a time domain. In this case, the guard interval is longer, the system is more robust.

The Pilot Pattern in the Table 2 may represent Dx of the pilot pattern. Although it is not shown in the Table 2 explicitly, Dy may be all 1 in the example of Table 2. For example, Dx=3 may mean that one pilot for channel estimation is included in x-axis direction in every three symbols. For example, Dy=1 may mean the pilot is included every time in y-axis direction.

As shown in the Table 2, the preamble structure corresponding to a second modulation scheme/code rate which is more robust than a first modulation scheme/code rate may be allocated in the lookup table prior to the preamble structure corresponding to the first modulation scheme/code rate.

In this case, the being allocated prior to other preamble structure may mean being stored in the lookup table corresponding to a serial number less than the serial number of the other preamble structure.

Furthermore, the preamble structure corresponding to a second FFT size which is shorter than a first FFT size may be allocated in the lookup table prior to the preamble structure corresponding to a first FFT size in case of the same modulation scheme/code rate.

Furthermore, the preamble structure corresponding to a second guard interval which is longer than a first guard interval may be allocated in the lookup table prior to the preamble structure corresponding to the first guard interval in case of the same modulation scheme/code rate and the same FFT size.

As shown in the Table 2, the setting of the order in which the preamble structures are assigned in the lookup table may make the recognition of the preamble structure using the bootstrap more efficient.

Figure 5:
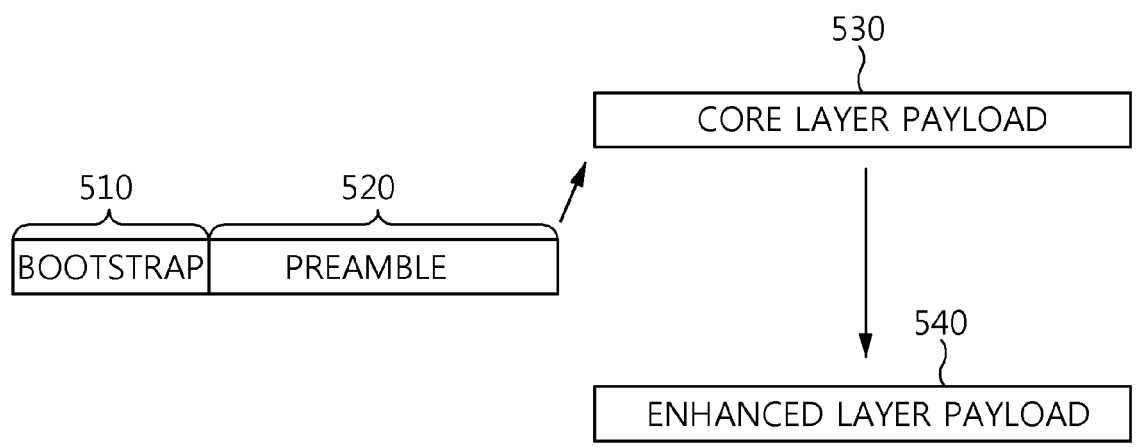
FIG. 5 is a diagram showing an example of the receiving process of the broadcast signal frame shown in FIG. 4.

FIG. 5 is a diagram showing an example of the receiving process of the broadcast signal frame shown in FIG. 4.

Referring to FIG. 5, the bootstrap 510 is detected and demodulated, and the signaling information is reconstructed by the demodulation of the preamble 520 using the demodulated information.

The core layer data 530 is demodulated using the signaling information and the enhanced layer signal is demodulated through the cancellation process corresponding to the core layer data. In this case, the cancellation corresponding to the core layer data will be described in detail later.

Figure 6:
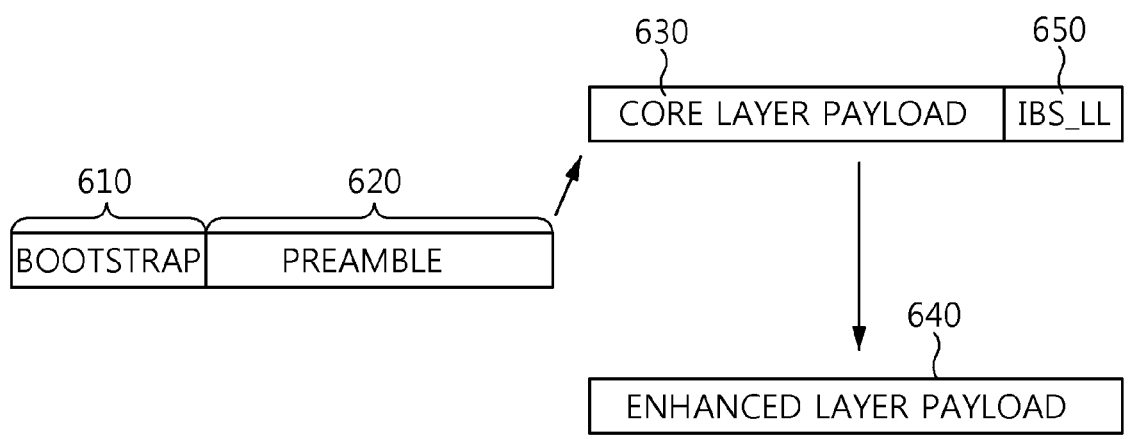
FIG. 6 is a diagram showing another example of the receiving process of the broadcast signal frame shown in FIG. 4.

FIG. 6 is a diagram showing another example of the receiving process of the broadcast signal frame shown in FIG. 4.

Referring to FIG. 6, the bootstrap 610 is detected and demodulated, and the signaling information is reconstructed by the demodulation of the preamble 620 using the demodulated information.

The core layer data 630 is demodulated using the signaling information. In this case, the core layer data 630 includes in-band signaling section 650. The in-band signaling section 650 includes signaling information for the enhanced layer service. The bandwidth is used more efficiently through the in-band signaling section 650. In this case, the in-band signaling section 650 may be included in the core layer which is more robust than the enhanced layer.

The basic signaling information and the information for the core layer service may be transferred through the preamble 620 and the signaling information for the enhanced layer service may be transferred through the in-band signaling section 650 in the example of the FIG. 6.

The enhanced layer signal is demodulated through the cancellation process corresponding to the core layer data.

In this case, the signaling information may be L1 (Layer-1) signaling information. The L1 signaling information may include information for physical layer parameters.

Referring to FIG. 4, a broadcast signal frame includes an L1 signaling signal and a data signal. For example, the broadcast signal frame may be an ATSC 3.0 frame.

Figure 7:
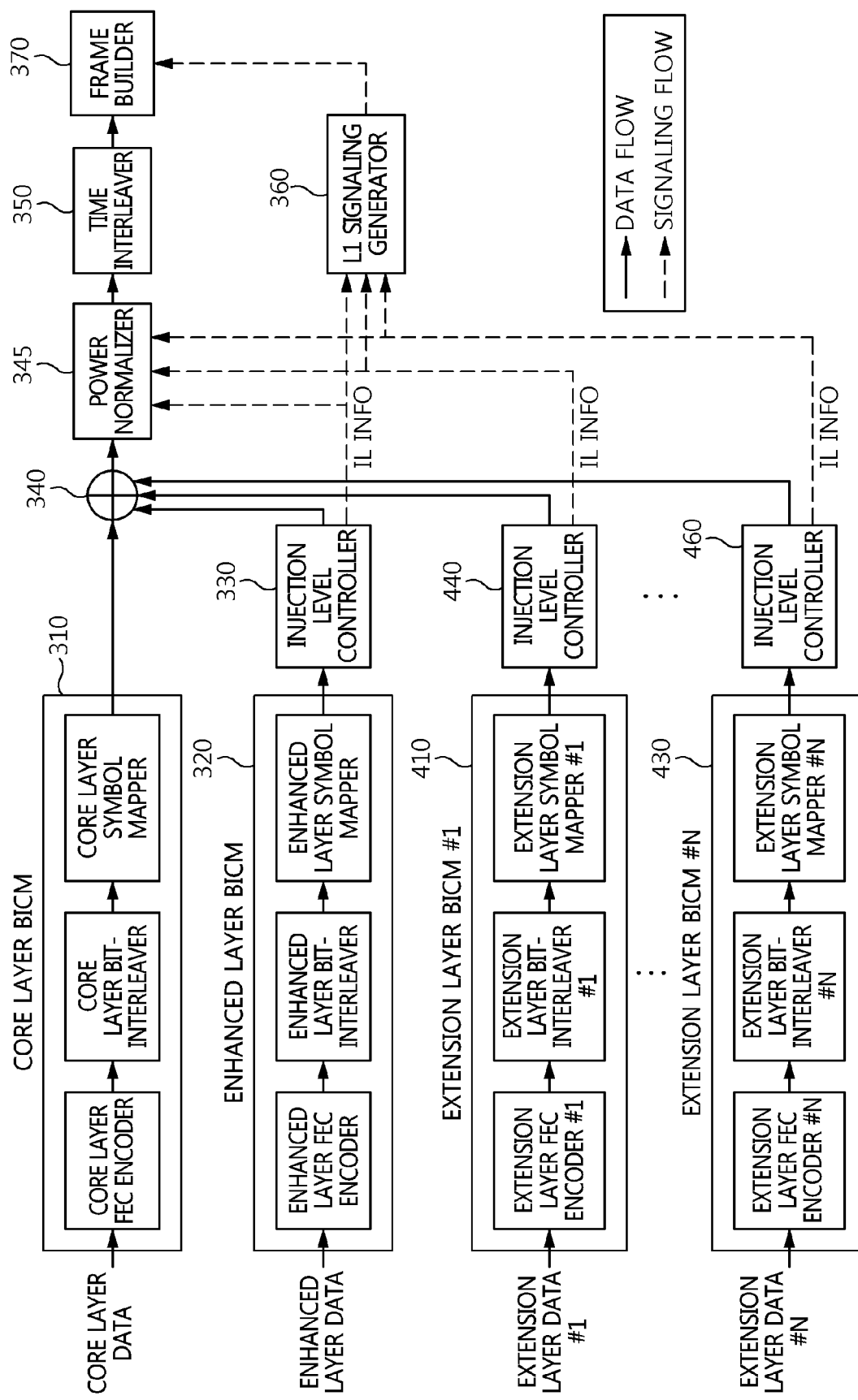
FIG. 7 is a block diagram showing another example of the apparatus for generating broadcast signal frame shown in FIG. 1.

FIG. 7 is a block diagram showing another example of the apparatus for generating broadcast signal frame shown in FIG. 1.

Referring to FIG. 7, it can be seen that an apparatus for generating broadcast signal frame multiplexes data corresponding to N (N is a natural number that is equal to or larger than 1) extension layers together in addition to core layer data and enhanced layer data.

That is, the apparatus for generating the broadcast signal frame in FIG. 7 includes N extension layer BICM units 410, . . . , 430 and injection level controllers 440, . . . , 460 in addition to a core layer BICM unit 310, an enhanced layer BICM unit 320, an injection level controller 330, a combiner 340, a power normalizer 345, a time interleaver 350, a signaling generation unit 360, and a frame builder 370.

The core layer BICM unit 310, enhanced layer BICM unit 320, injection level controller 330, combiner 340, power normalizer 345, time interleaver 350, signaling generation unit 360 and frame builder 370 shown in FIG. 7 have been described in detail with reference to FIG. 3.

Each of the N extension layer BICM units 410, ..., 430 independently performs BICM encoding, and each of the injection level controllers 440, ..., 460 performs power reduction corresponding to a corresponding extension layer, thereby enabling a power reduced extension layer signal to be combined with other layer signals via the combiner 340.

In this case, each of the error correction encoders of the extension layer BICM units 410, ..., 430 may be formed by connecting a BCH encoder and an LDPC encoder in series.

In particular, it is preferred that a reduction in power corresponding to each of the injection level controllers 440, ..., 460 be higher than the reduction in power of the injection level controller 330. That is, a lower one of the injection level controllers 330, 440, ..., 460 shown in FIG. 7 may correspond to a larger reduction in power.

Injection level information provided by the injection level controllers 330, 440 and 460 shown in FIG. 7 is included in the broadcast signal frame of the frame builder 370 via the signaling generation unit 360, and is then transmitted to the receiver. That is, the injection level of each layer is contained in the L1 signaling information and then transferred to the receiver.

In the present invention, the adjustment of power may correspond to increasing or decreasing the power of an input signal, and may correspond to increasing or decreasing the gain of an input signal.

The power normalizer 345 mitigates an increase in power caused by the combination of a plurality of layer signals by means of the combiner 340.

In the example shown in FIG. 7, the power normalizer 345 may adjust the power of a signal to appropriate magnitude by multiplying the magnitude of a signal, into which the signals of the respective layers are combined, by a normalizing factor by using Equation 4 below:

$$\text{Normalizing factor} = \left( \sqrt{\left(1 + 10^{-\text{Injection level }\#1(dB)/10} + 10^{-\text{Injection level }\#2(dB)/10} + \ldots + 10^{=\text{Injection level }\#(N+1)(dB)/10} \right)} \right)^{-1} \quad (4)$$

The time interleaver 350 performs interleaving equally applied to the signals of the layers by interleaving the signals combined by the combiner 340.

Figure 8:
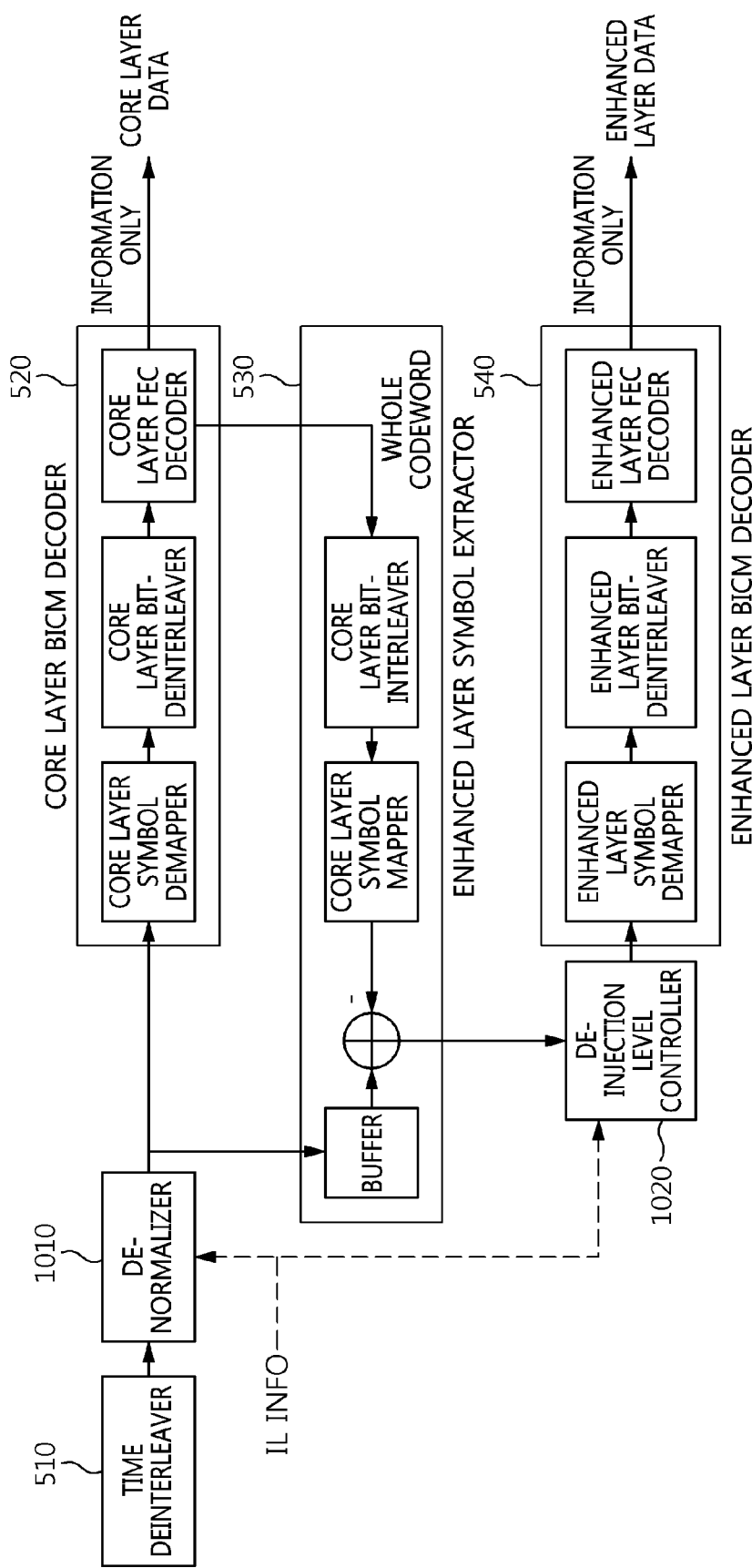
FIG. 8 is a block diagram showing an example of the signal demultiplexer shown in FIG. 1.

FIG. 8 is a block diagram showing still an example of the signal demultiplexer shown in FIG. 1.

Referring to FIG. 8, a signal demultiplexer according to an embodiment of the present invention includes a time deinterleaver 510, a de-normalizer 1010, core layer BICM decoder 520, an enhanced layer symbol extractor 530, a de-injection level controller 1020, and an enhanced layer BICM decoder 540.

In this case, the signal demultiplexer shown in FIG. 8 may correspond to the apparatus for generating the broadcast signal frame shown in FIG. 3.

The time deinterleaver 510 receives a received signal from an OFDM receiver for performing operations, such as time/frequency synchronization, channel estimation and equalization, and performs an operation related to the distribution of burst errors occurring over a channel. In this case, the L1 signaling information is decoded by the OFDM receiver first, and is then used for the decoding of data. In particular, the injection level information of the L1 signaling information may be transferred to the de-normalizer 1010 and the de-injection level controller 1020. In this case, the OFDM receiver may decode the received signal in the form of a broadcast signal frame, for example, an ATSC 3.0 frame, may extract the data symbol part of the frame, and may provide the extracted data symbol part to the time deinterleaver 510. That is, the time deinterleaver 510 distributes burst errors occurring over a channel by performing deinterleaving while passing a data symbol therethrough.

The de-normalizer 1010 corresponds to the power normalizer of the transmitter, and increases power by a level by which the power normalizer has decreased the power. That is, the de-normalizer 1010 divides the received signal by the normalizing factor of Equation 2.

Although the de-normalizer 1010 is illustrated as adjusting the power of the output signal of the time interleaver 510 in the example shown in FIG. 8, the de-normalizer 1010 may be located before the time interleaver 510 so that power adjustment is performed before interleaving in some embodiments.

That is, the de-normalizer 1010 may be viewed as being located before or after the time interleaver 510 and amplifying the magnitude of a signal for the purpose of the LLR calculation of the core layer symbol demapper.

The output of the time deinterleaver 510 (or the output of the de-normalizer 1010) is provided to the core layer BICM decoder 520, and the core layer BICM decoder 520 restores core layer data.

In this case, the core layer BICM decoder 520 includes a core layer symbol demapper, a core layer bit deinterleaver, and a core layer error correction decoder. The core layer symbol demapper calculates LLR values related to symbols, the core layer bit deinterleaver strongly mixes the calculated LLR values with burst errors, and the core layer error correction decoder corrects error occurring over a channel.

In this case, the core layer symbol demapper may calculate an LLR value for each bit using a predetermined constellation. In this case, the constellation used by the core layer symbol mapper may vary depending on the combination of the code rate and the modulation order that are used by the transmitter.

In this case, the core layer bit deinterleaver may perform deinterleaving on calculated LLR values on an LDPC code word basis.

In particular, the core layer error correction decoder may output only information bits, or may output all bits in which information bits have been mixed with parity bits. In this case, the core layer error correction decoder may output only information bits as core layer data, and may output all bits in which information bits have been mixed with parity bits to the enhanced layer symbol extractor 530.

The core layer error correction decoder may be formed by connecting a core layer LDPC decoder and a core layer BCH decoder in series. That is, the input of the core layer error correction decoder may be input to the core layer LDPC decoder, the output of the core layer LDPC decoder may be input to the core layer BCH decoder, and the output of the core layer BCH decoder may become the output of the core layer error correction decoder. In this case, the LDPC decoder performs LDPC decoding, and the BCH decoder performs BCH decoding.

Furthermore, the enhanced layer error correction decoder may be formed by connecting an enhanced layer LDPC decoder and an enhanced layer BCH decoder in series. That is, the input of the enhanced layer error correction decoder may be input to the enhanced layer LDPC decoder, the output of the enhanced layer LDPC decoder may be input to the enhanced layer BCH decoder, and the output of the enhanced layer BCH decoder may become the output of the enhanced layer error correction decoder.

The enhanced layer symbol extractor 530 may receive all bits from the core layer error correction decoder of the core layer BICM decoder 520, may extract enhanced layer symbols from the output signal of the time deinterleaver 510 or de-normalizer 1010. In an embodiment, the enhanced layer symbol extractor 530 may not be provided with all bits by the error correction decoder of the core layer BICM decoder 520, but may be provided with LDPC information bits or BCH information bits by the error correction decoder of the core layer BICM decoder 520.

In this case, the enhanced layer symbol extractor 530 includes a buffer, a subtracter, a core layer symbol mapper, and a core layer bit interleaver. The buffer stores the output signal of the time deinterleaver 510 or de-normalizer 1010. The core layer bit interleaver receives the all bits (information bits+parity bits) of the core layer BICM decoder, and performs the same core layer bit interleaving as the transmitter. The core layer symbol mapper generates core layer symbols, which are the same as the transmitter, from the interleaved signal. The subtracter obtains enhanced layer symbols by subtracting the output signal of the core layer symbol mapper from the signal stored in the buffer, and transfers the enhanced layer symbols to the de-injection level controller 1020. In particular, when LDPC information bits are provided, the enhanced layer symbol extractor 530 may further include a core layer LDPC encoder. Furthermore, when BCH information bits are provided, the enhanced layer symbol extractor 530 may further include not only a core layer LDPC encoder but also a core layer BCH encoder.

In this case, the core layer LDPC encoder, core layer BCH encoder, core layer bit interleaver and core layer symbol mapper included in the enhanced layer symbol extractor 530 may be the same as the LDPC encoder, BCH encoder, bit interleaver and symbol mapper of the core layer described with reference to FIG. 3.

The de-injection level controller 1020 receives the enhanced layer symbols, and increases the power of the input signal by a level by which the injection level controller of the transmitter has decreased the power. That is, the de-injection level controller 1020 amplifies the input signal, and provides the amplified input signal to the enhanced layer BICM decoder 540. For example, if at the transmitter, the power used to combine the enhanced layer signal is lower than the power used to combine the core layer signal by 3 dB, the de-injection level controller 1020 functions to increase the power of the input signal by 3 dB.

In this case, the de-injection level controller 1020 may be viewed as receiving injection level information from the OFDM receiver and multiplying an extracted enhanced layer signal by the enhanced layer gain of Equation 5:

$$\text{Enhanced layer gain} = (\sqrt{10^{-Injectionlevel(dB)/10}})^{-1} \qquad (5)$$

The enhanced layer BICM decoder 540 receives the enhanced layer symbol whose power has been increased by the de-injection level controller 1020, and restores the enhanced layer data.

In this case, the enhanced layer BICM decoder 540 may include an enhanced layer symbol demapper, an enhanced layer bit deinterleaver, and an enhanced layer error correction decoder. The enhanced layer symbol demapper calculates LLR values related to the enhanced layer symbols, the enhanced layer bit deinterleaver strongly mixes the calculated LLR values with burst errors, and the enhanced layer error correction decoder corrects error occurring over a channel.

Although the enhanced layer BICM decoder 540 performs a task similar to a task that is performed by the core layer BICM decoder 520, the enhanced layer LDPC decoder generally performs LDPC decoding related to a code rate equal to or higher than 6/15.

For example, the core layer may use LDPC code having a code rate equal to or higher than 5/15, and the enhanced layer may use LDPC code having a code rate equal to or higher than 6/15. In this case, in a reception environment in which enhanced layer data can be decoded, core layer data may be decoded using only a small number of LDPC decoding iterations. Using this characteristic, in the hardware of the receiver, a single LDPC decoder is shared by the core layer and the enhanced layer, and thus the cost required to implement the hardware can be reduced. In this case, the core layer LDPC decoder may use only some time resources (LDPC decoding iterations), and the enhanced layer LDPC decoder may use most time resources.

That is, the signal demultiplexer shown in FIG. 8 restores core layer data first, leaves only the enhanced layer symbols by cancellation the core layer symbols in the received signal symbols, and then restores enhanced layer data by increasing the power of the enhanced layer symbols. As described with reference to FIGS. 3 and 5, signals corresponding to respective layers are combined at different power levels, and thus data restoration having the smallest error can be achieved only if restoration starts with a signal combined with the strongest power.

Accordingly, in the example shown in FIG. 8, the signal demultiplexer may include the time deinterleaver 510 configured to generate a time-deinterleaved signal by applying time deinterleaving to a received signal; a de-normalizer 1010 configured to increase the power of the received signal or the time-deinterleaved signal by a level corresponding to a reduction in power by the power normalizer of the transmitter; the core layer BICM decoder 520 configured to restore core layer data from the signal power-adjusted by the de-normalizer 1010; the enhanced layer symbol extractor 530 configured to extract an enhanced layer signal by performing cancellation, corresponding to the core layer data, on the signal power-adjusted by the de-normalizer 1010 using the output signal of the core layer FEC decoder of the core layer BICM decoder 520; a de-injection level controller 1020 configured to increase the power of the enhanced layer signal by a level corresponding to a reduction in power by the injection power level controller of the transmitter; and an enhanced layer BICM decoder 540 configured to restore enhanced layer data using the output signal of the de-injection level controller 1020.

In this case, the enhanced layer symbol extractor may receive all code words from the core layer LDPC decoder of the core layer BICM decoder, and may immediately perform bit interleaving on the all code words.

In this case, the enhanced layer symbol extractor may receive information bits from the core layer LDPC decoder of the core layer BICM decoder, and may perform core layer LDPC encoding and then bit interleaving on the information bits.

In this case, the enhanced layer symbol extractor may receive information bits from the core layer BCH decoder of the core layer BICM decoder, and may perform core layer BCH encoding and core layer LDPC encoding and then bit interleaving on the information bits.

In this case, the de-normalizer and the de-injection level controller may receive injection level information IL INFO provided based on L1 signaling, and may perform power control based on the injection level information.

In this case, the core layer BICM decoder may have a bit rate lower than that of the enhanced layer BICM decoder, and may be more robust than the enhanced layer BICM decoder.

In this case, the de-normalizer may correspond to the reciprocal of the normalizing factor.

In this case, the de-injection level controller may correspond to the reciprocal of the scaling factor.

In this case, the enhanced layer data may be restored based on cancellation corresponding to the restoration of core layer data corresponding to the core layer signal.

In this case, the signal demultiplexer further may include one or more extension layer symbol extractors each configured to extract an extension layer signal by performing cancellation corresponding to previous layer data; one or more de-injection level controllers each configured to increase the power of the extension layer signal by a level corresponding to a reduction in power by the injection level controller of the transmitter; and one or more extension layer BICM decoders configured to restore one or more pieces of extension layer data using the output signals of the one or more de-injection level controllers.

From the configuration shown in FIG. 8, it can be seen that a signal demultiplexing method according to an embodiment of the present invention includes generating a time-deinterleaved signal by applying time deinterleaving to a received signal; increasing the power of the received signal or the time-deinterleaved signal by a level corresponding to a reduction in power by the power normalizer of the transmitter; restoring core layer data from the power-adjusted signal; extracting an enhanced layer signal by performing cancellation, corresponding to the core layer data, on the power-adjusted signal; increasing the power of the enhanced layer signal by a level corresponding to a reduction in power by the injection power level controller of the transmitter; and restoring enhanced layer data using the enhanced layer data.

In this case, extracting the enhanced layer signal may include receiving all code words from the core layer LDPC decoder of the core layer BICM decoder, and immediately performing bit interleaving on the all code words.

In this case, extracting the enhanced layer signal may include receiving information bits from the core layer LDPC decoder of the core layer BICM decoder, and performing core layer LDPC encoding and then bit interleaving on the information bits.

In this case, extracting the enhanced layer signal may include receiving information bits from the core layer BCH decoder of the core layer BICM decoder, and performing core layer BCH encoding and core layer LDPC encoding and then bit interleaving on the information bits.

Figure 9:
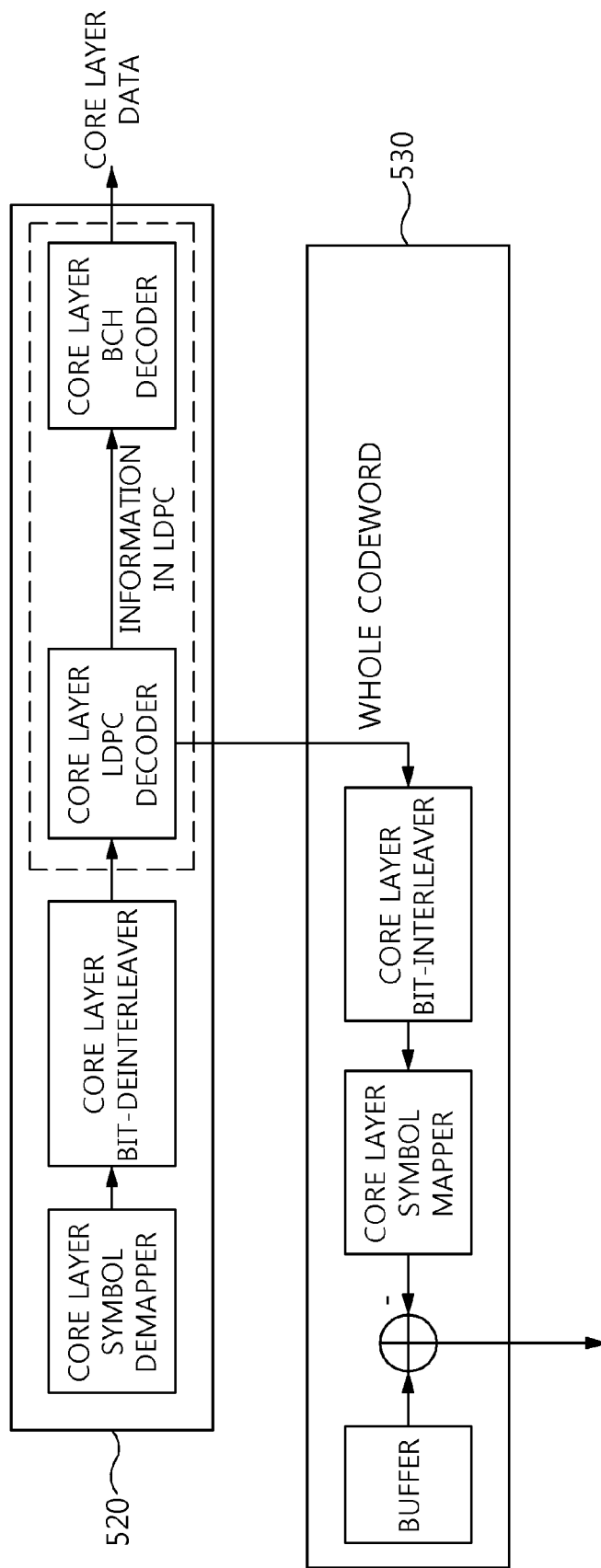
FIG. 9 is a block diagram showing an example of the core layer BICM decoder and the enhanced layer symbol extractor shown in FIG. 8.

FIG. 9 is a block diagram showing an example of the core layer BICM decoder 520 and the enhanced layer symbol extractor 530 shown in FIG. 8.

Referring to FIG. 9, the core layer BICM decoder 520 includes a core layer symbol demapper, a core layer bit deinterleaver, a core layer LDPC decoder, and a core layer BCH decoder.

That is, in the example shown in FIG. 9, the core layer error correction decoder includes the core layer LDPC decoder and the core layer BCH decoder.

Furthermore, in the example shown in FIG. 9, the core layer LDPC decoder provides all code words, including parity bits, to the enhanced layer symbol extractor 530. That is, although the LDPC decoder generally outputs only the information bits of all the LDPC code words, the LDPC decoder may output all the code words.

In this case, although the enhanced layer symbol extractor 530 may be easily implemented because it does not need to include a core layer LDPC encoder or a core layer BCH encoder, there is a possibility that a residual error may remain in the LDPC code parity part.

Figure 10:
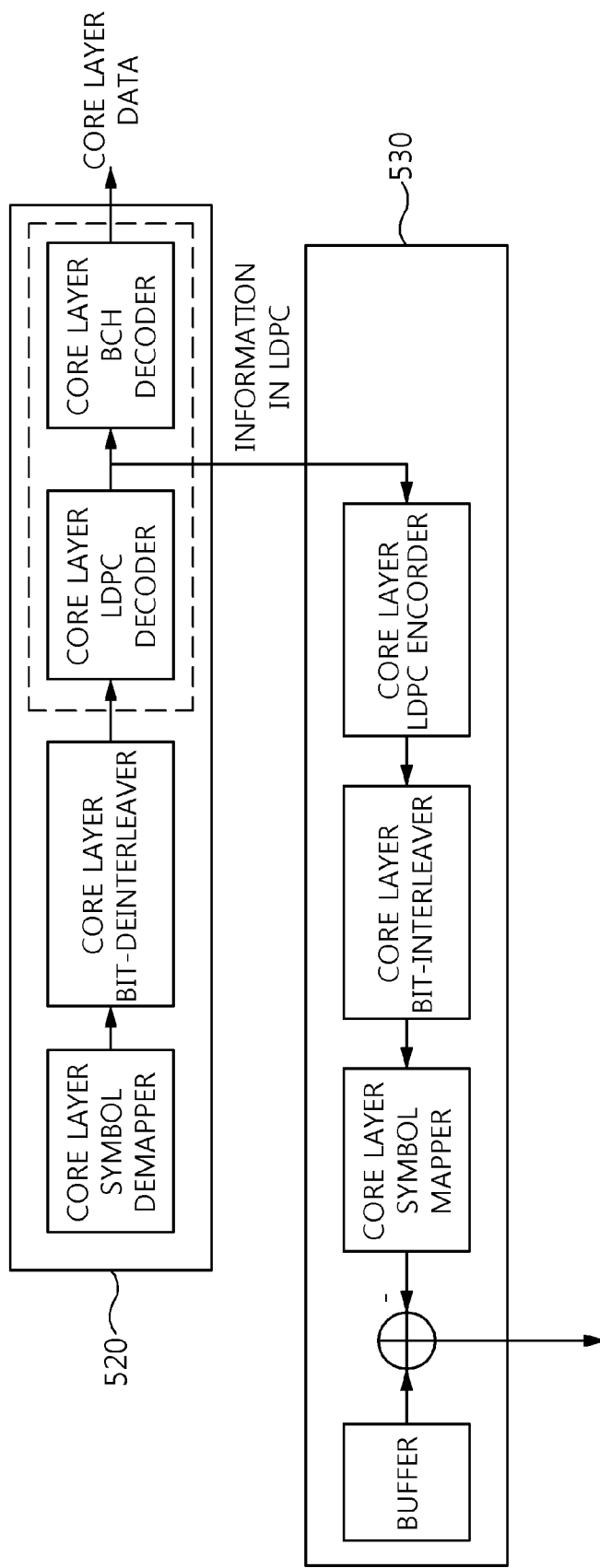
FIG. 10 is a block diagram showing another example of the core layer BICM decoder and the enhanced layer symbol extractor shown in FIG. 8.

FIG. 10 is a block diagram showing another example of the core layer BICM decoder 520 and the enhanced layer symbol extractor 530 shown in FIG. 8.

Referring to FIG. 10, the core layer BICM decoder 520 includes a core layer symbol demapper, a core layer bit deinterleaver, a core layer LDPC decoder, and a core layer BCH decoder.

That is, in the example shown in FIG. 10, the core layer error correction decoder includes the core layer LDPC decoder and the core layer BCH decoder.

Furthermore, in the example shown in FIG. 10, the core layer LDPC decoder provides information bits, excluding parity bits, to the enhanced layer symbol extractor 530.

In this case, although the enhanced layer symbol extractor 530 does not need to include a core layer BCH encoder, it must include a core layer LDPC encoder.

A residual error that may remain in the LDPC code parity part may be eliminated more desirably in the example shown in FIG. 10 than in the example shown in FIG. 9.

Figure 11:
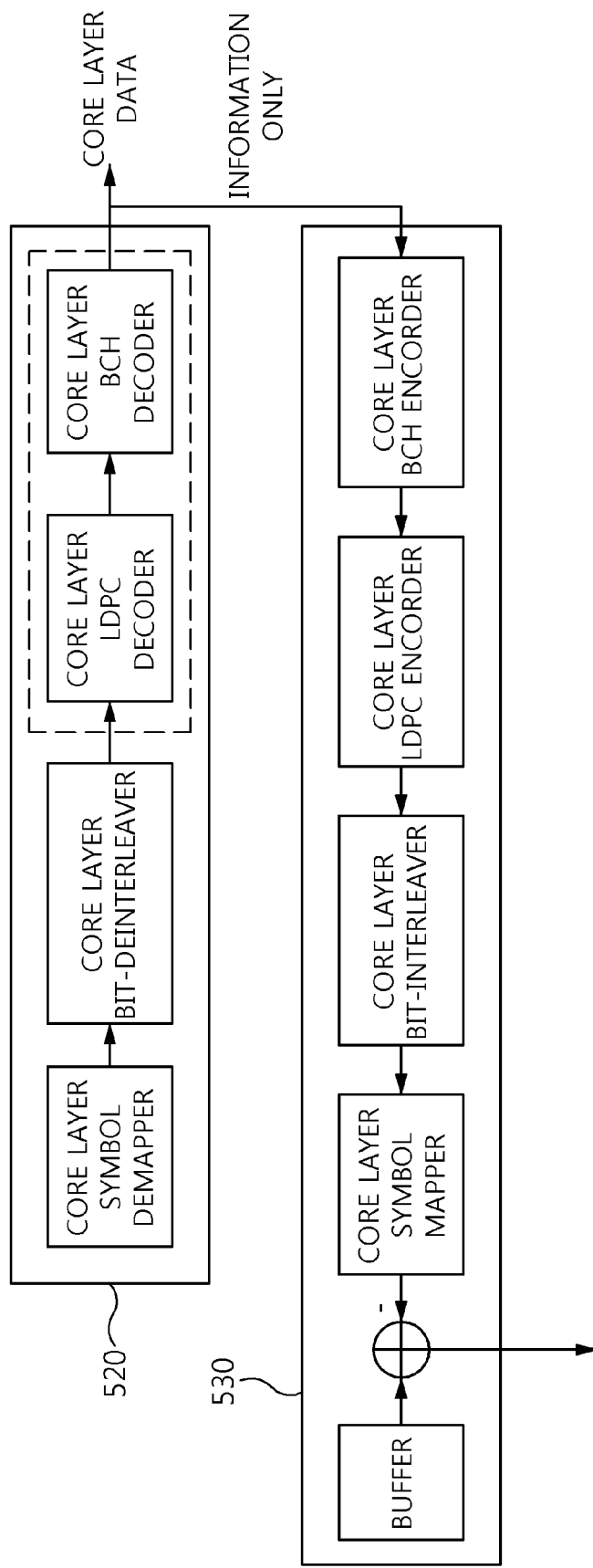
FIG. 11 is a block diagram showing still another example of the core layer BICM decoder and the enhanced layer symbol extractor shown in FIG. 8.

FIG. 11 is a block diagram showing still another example of the core layer BICM decoder 520 and the enhanced layer symbol extractor 530 shown in FIG. 8.

Referring to FIG. 11, the core layer BICM decoder 520 includes a core layer symbol demapper, a core layer bit deinterleaver, a core layer LDPC decoder, and a core layer BCH decoder.

That is, in the example shown in FIG. 11, the core layer error correction decoder includes the core layer LDPC decoder and the core layer BCH decoder.

In the example shown in FIG. 11, the output of the core layer BCH decoder corresponding to core layer data is provided to the enhanced layer symbol extractor 530.

In this case, although the enhanced layer symbol extractor 530 has high complexity because it must include both a core layer LDPC encoder and a core layer BCH encoder, it guarantees higher performance than those in the examples of FIGS. 9 and 10.

Figure 12:
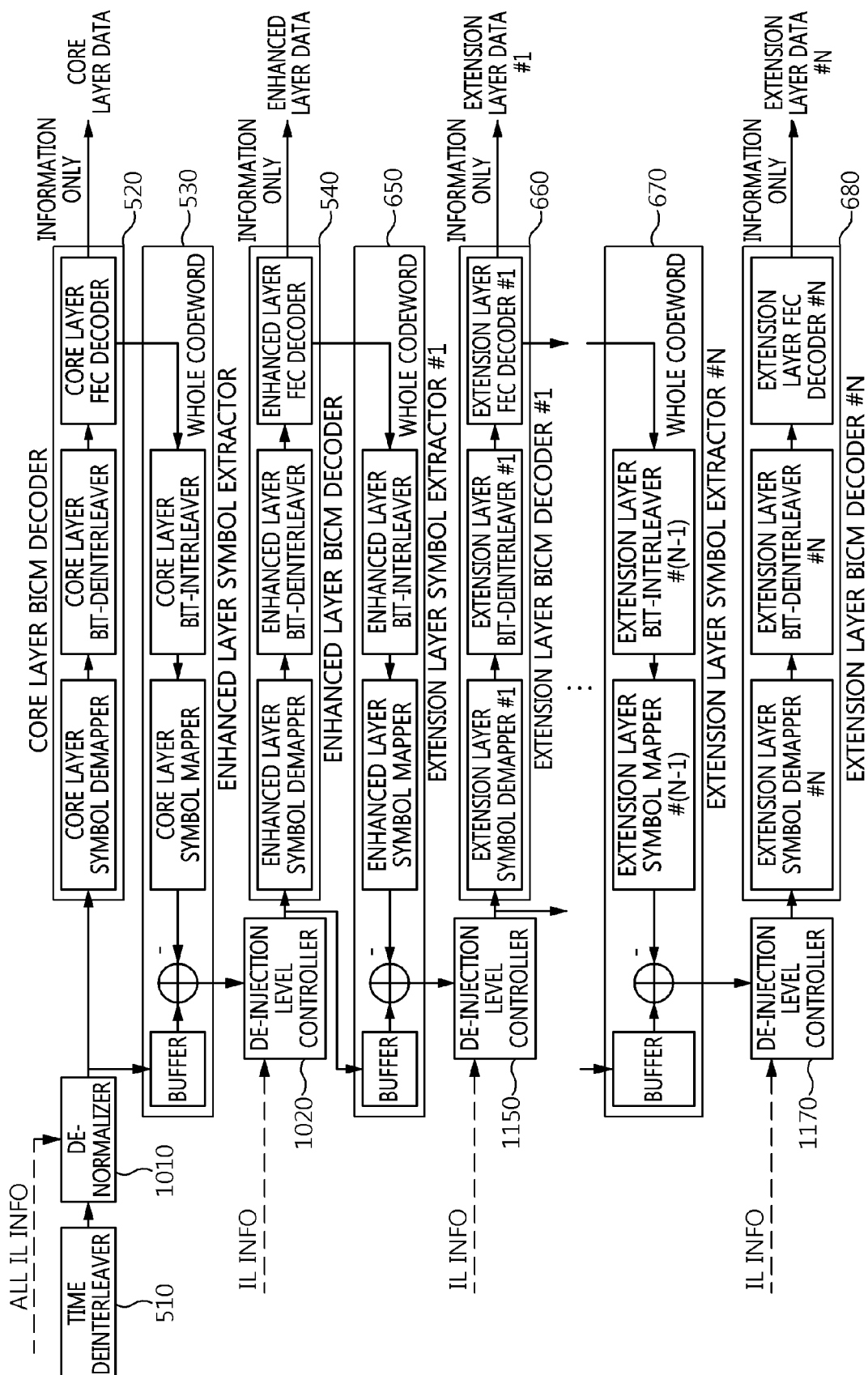
FIG. 12 is a block diagram showing another example of the signal demultiplexer shown in FIG. 1.

FIG. 12 is a block diagram showing another example of the signal demultiplexer shown in FIG. 1.

Referring to FIG. 12, a signal demultiplexer according to an embodiment of the present invention includes a time deinterleaver 510, a de-normalizer 1010, a core layer BICM decoder 520, an enhanced layer symbol extractor 530, an enhanced layer BICM decoder 540, one or more extension layer symbol extractors 650 and 670, one or more extension layer BICM decoders 660 and 680, and de-injection level controllers 1020, 1150 and 1170.

In this case, the signal demultiplexer shown in FIG. 12 may correspond to the apparatus for generating broadcast signal frame shown in FIG. 7.

The time deinterleaver 510 receives a received signal from an OFDM receiver for performing operations, such as synchronization, channel estimation and equalization, and performs an operation related to the distribution of burst errors occurring over a channel. In this case, L1 signaling information may be decoded by the OFDM receiver first, and then may be used for data decoding. In particular, the injection level information of the L1 signaling information may be transferred to the de-normalizer 1010 and the de-injection level controllers 1020, 1150 and 1170.

In this case, the de-normalizer 1010 may obtain the injection level information of all layers, may obtain a de-normalizing factor using Equation 6 below, and may multiply the input signal with the de-normalizing factor:

$$\text{De-normalizing factor} = (\text{normalizing factor})^{-1} = \left( \sqrt{1 + 10^{-\text{Injection level \#1}(dB)/10} + 10^{-\text{Injection level \#2}(dB)/10} + \ldots + 10^{-\text{Injection level \#}(N+1)(dB)/10}} \right) \quad (6)$$

That is, the de-normalizing factor is the reciprocal of the normalizing factor expressed by Equation 4 above.

In an embodiment, when the N1 signaling includes not only injection level information but also normalizing factor information, the de-normalizer 1010 may simply obtain a de-normalizing factor by taking the reciprocal of a normalizing factor without the need to calculate the de-normalizing factor using an injection level.

The de-normalizer 1010 corresponds to the power normalizer of the transmitter, and increases power by a level by which the power normalizer has decreased the power.

Although the de-normalizer 1010 is illustrated as adjusting the power of the output signal of the time interleaver 510 in the example shown in FIG. 12, the de-normalizer 1010 may be located before the time interleaver 510 so that power adjustment can be performed before interleaving in an embodiment.

That is, the de-normalizer 1010 may be viewed as being located before or after the time interleaver 510 and amplifying the magnitude of a signal for the purpose of the LLR calculation of the core layer symbol demapper.

The output of the time deinterleaver 510 (or the output of the de-normalizer 1010) is provided to the core layer BICM decoder 520, and the core layer BICM decoder 520 restores core layer data.

In this case, the core layer BICM decoder 520 includes a core layer symbol demapper, a core layer bit deinterleaver, and a core layer error correction decoder. The core layer symbol demapper calculates LLR values related to symbols, the core layer bit deinterleaver strongly mixes the calculated LLR values with burst errors, and the core layer error correction decoder corrects error occurring over a channel.

In particular, the core layer error correction decoder may output only information bits, or may output all bits in which information bits have been combined with parity bits. In this case, the core layer error correction decoder may output only information bits as core layer data, and may output all bits in which information bits have been combined with parity bits to the enhanced layer symbol extractor 530.

The core layer error correction decoder may be formed by connecting a core layer LDPC decoder and a core layer BCH decoder in series. That is, the input of the core layer error correction decoder may be input to the core layer LDPC decoder, the output of the core layer LDPC decoder may be input to the core layer BCH decoder, and the output of the core layer BCH decoder may become the output of the core layer error correction decoder. In this case, the LDPC decoder performs LDPC decoding, and the BCH decoder performs BCH decoding.

The enhanced layer error correction decoder may be also formed by connecting an enhanced layer LDPC decoder and an enhanced layer BCH decoder in series. That is, the input of the enhanced layer error correction decoder may be input to the enhanced layer LDPC decoder, the output of the enhanced layer LDPC decoder may be input to the enhanced layer BCH decoder, and the output of the enhanced layer BCH decoder may become the output of the enhanced layer error correction decoder.

Moreover, the extension layer error correction decoder may be also formed by connecting an extension layer LDPC decoder and an extension layer BCH decoder in series. That is, the input of the extension layer error correction decoder may be input to the extension layer LDPC decoder, the output of the extension layer LDPC decoder may be input to the extension layer BCH decoder, and the output of the extension layer BCH decoder may become the output of the extension layer error correction decoder.

In particular, the tradeoff between the complexity of implementation, regarding which of the outputs of the error correction decoders will be used, which has been described with reference to FIGS. 9, 10 and 11, and performance is applied to not only the core layer BICM decoder 520 and enhanced layer symbol extractor 530 of FIG. 12 but also the extension layer symbol extractors 650 and 670 and the extension layer BICM decoders 660 and 680.

The enhanced layer symbol extractor 530 may receive the all bits from the core layer BICM decoder 520 of the core layer error correction decoder, and may extract enhanced layer symbols from the output signal of the time deinterleaver 510 or the denormalizer 1010. In an embodiment, the enhanced layer symbol extractor 530 may not receive all bits from the error correction decoder of the core layer BICM decoder 520, but may receive LDPC information bits or BCH information bits.

In this case, the enhanced layer symbol extractor 530 includes a buffer, a subtracter, a core layer symbol mapper, and a core layer bit interleaver. The buffer stores the output signal of the time deinterleaver 510 or de-normalizer 1010. The core layer bit interleaver receives the all bits (information bits+parity bits) of the core layer BICM decoder, and performs the same core layer bit interleaving as the transmitter. The core layer symbol mapper generates core layer symbols, which are the same as the transmitter, from the interleaved signal. The subtracter obtains enhanced layer symbols by subtracting the output signal of the core layer symbol mapper from the signal stored in the buffer, and transfers the enhanced layer symbols to the de-injection level controller 1020.

In this case, the core layer bit interleaver and core layer symbol mapper included in the enhanced layer symbol extractor 530 may be the same as the core layer bit interleaver and the core layer symbol mapper shown in FIG. 7.

The de-injection level controller 1020 receives the enhanced layer symbols, and increases the power of the input signal by a level by which the injection level controller of the transmitter has decreased the power. That is, the de-injection level controller 1020 amplifies the input signal, and provides the amplified input signal to the enhanced layer BICM decoder 540.

The enhanced layer BICM decoder 540 receives the enhanced layer symbol whose power has been increased by the de-injection level controller 1020, and restores the enhanced layer data.

In this case, the enhanced layer BICM decoder 540 may include an enhanced layer symbol demapper, an enhanced layer bit deinterleaver, and an enhanced layer error correction decoder. The enhanced layer symbol demapper calculates LLR values related to the enhanced layer symbols, the enhanced layer bit deinterleaver strongly mixes the calculated LLR values with burst errors, and the enhanced layer error correction decoder corrects error occurring over a channel.

In particular, the enhanced layer error correction decoder may output only information bits, and may output all bits in which information bits have been combined with parity bits. In this case, the enhanced layer error correction decoder may output only information bits as enhanced layer data, and may output all bits in which information bits have been mixed with parity bits to the extension layer symbol extractor 650.

The extension layer symbol extractor 650 receives all bits from the enhanced layer error correction decoder of the enhanced layer BICM decoder 540, and extracts extension layer symbols from the output signal of the de-injection level controller 1020.

In this case, the de-injection level controller 1020 may amplify the power of the output signal of the subtracter of the enhanced layer symbol extractor 530.

In this case, the extension layer symbol extractor 650 includes a buffer, a subtracter, an enhanced layer symbol mapper, and an enhanced layer bit interleaver. The buffer stores the output signal of the de-injection level controller 1020. The enhanced layer bit interleaver receives the all bits (information bits+parity bits) of the enhanced layer BICM decoder, and performs enhanced layer bit interleaving that is the same as that of the transmitter. The enhanced layer symbol mapper generates enhanced layer symbols, which are the same as those of the transmitter, from the interleaved signal. The subtracter obtains extension layer symbols by subtracting the output signal of the enhanced layer symbol mapper from the signal stored in the buffer, and transfers the extension layer symbols to the de-injection level controller 1150.

In this case, the enhanced layer bit interleaver and the enhanced layer symbol mapper included in the extension layer symbol extractor 650 may be the same as the enhanced layer bit interleaver and the enhanced layer symbol mapper shown in FIG. 7.

The de-injection level controller 1150 increases power by a level by which the injection level controller of a corresponding layer has decreased the power at the transmitter.

In this case, the de-injection level controller may be viewed as performing the operation of multiplying the extension layer gain of Equation 7 below. In this case, a 0-th injection level may be considered to be 0 dB:

$$n\text{-}th \text{ extension layer gain} = \frac{10^{-Injection\ level\ \#(n-1)(dB)/10}}{10^{-Injection\ level\ \#n(dB)/10}} \quad (7)$$

The extension layer BICM decoder 660 receives the extension layer symbols whose power has been increased by the de-injection level controller 1150, and restores extension layer data.

In this case, the extension layer BICM decoder 660 may include an extension layer symbol demapper, an extension layer bit deinterleaver, and an extension layer error correction decoder. The extension layer symbol demapper calculates LLR values related to the extension layer symbols, the extension layer bit deinterleaver strongly mixes the calculated LLR values with burst errors, and the extension layer error correction decoder corrects error occurring over a channel.

In particular, each of the extension layer symbol extractor and the extension layer BICM decoder may include two or more extractors or decoders if two or more extension layers are present.

That is, in the example shown in FIG. 12, the extension layer error correction decoder of the extension layer BICM decoder 660 may output only information bits, and may output all bits in which information bits have been combined with parity bits. In this case, the extension layer error correction decoder outputs only information bits as extension layer data, and may output all bits in which information bits have been mixed with parity bits to the subsequent extension layer symbol extractor 670.

The configuration and operation of the extension layer symbol extractor 670, the extension layer BICM decoder 680 and the de-injection level controller 1170 can be easily understood from the configuration and operation of the above-described extension layer symbol extractor 650, extension layer BICM decoder 660 and de-injection level controller 1150.

A lower one of the de-injection level controllers 1020, 1150 and 1170 shown in FIG. 12 may correspond to a larger increase in power. That is, the de-injection level controller 1150 may increase power more than the de-injection level controller 1020, and the de-injection level controller 1170 may increase power more than the de-injection level controller 1150.

It can be seen that the signal demultiplexer shown in FIG. 12 restores core layer data first, restores enhanced layer data using the cancellation of core layer symbols, and restores extension layer data using the cancellation of enhanced layer symbols. Two or more extension layers may be provided, in which case restoration starts with an extension layer combined at a higher power level.

Figure 13:
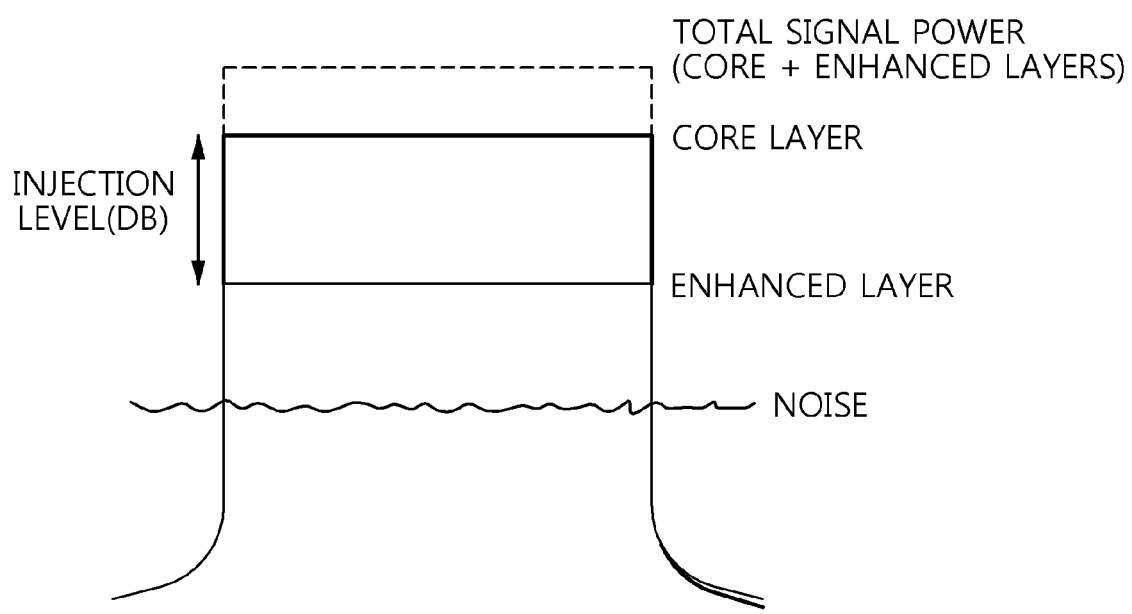
FIG. 13 is a diagram showing an increase in power attributable to the combination of a core layer signal and an enhanced layer signal.

FIG. 13 is a diagram showing in an increase in power attributable to the combination of a core layer signal and an enhanced layer signal.

Referring to FIG. 13, it can be seen that when a multiplexed signal is generated by combining a core layer signal with an enhanced layer signal whose power has been reduced by an injection level, the power level of the multiplexed signal is higher than the power level of the core layer signal or the enhanced layer signal.

In this case, the injection level that is adjusted by the injection level controllers shown in FIGS. 3 and 7 may be adjusted from 0 dB to 25.0 dB in steps of 0.5 dB or 1 dB. When the injection level is 3.0 dB, the power of the enhanced layer signal is lower than that of the core layer signal by 3 dB. When the injection level is 10.0 dB, the power of the enhanced layer signal is lower than that of the core layer signal by 10 dB. This relationship may be applied not only between a core layer signal and an enhanced layer signal but also between an enhanced layer signal and an extension layer signal or between extension layer signals.

The power normalizers shown in FIGS. 3 and 7 may adjust the power level after the combination, thereby solving problems, such as the distortion of the signal, that may be caused by an increase in power attributable to the combination.

Figure 14:
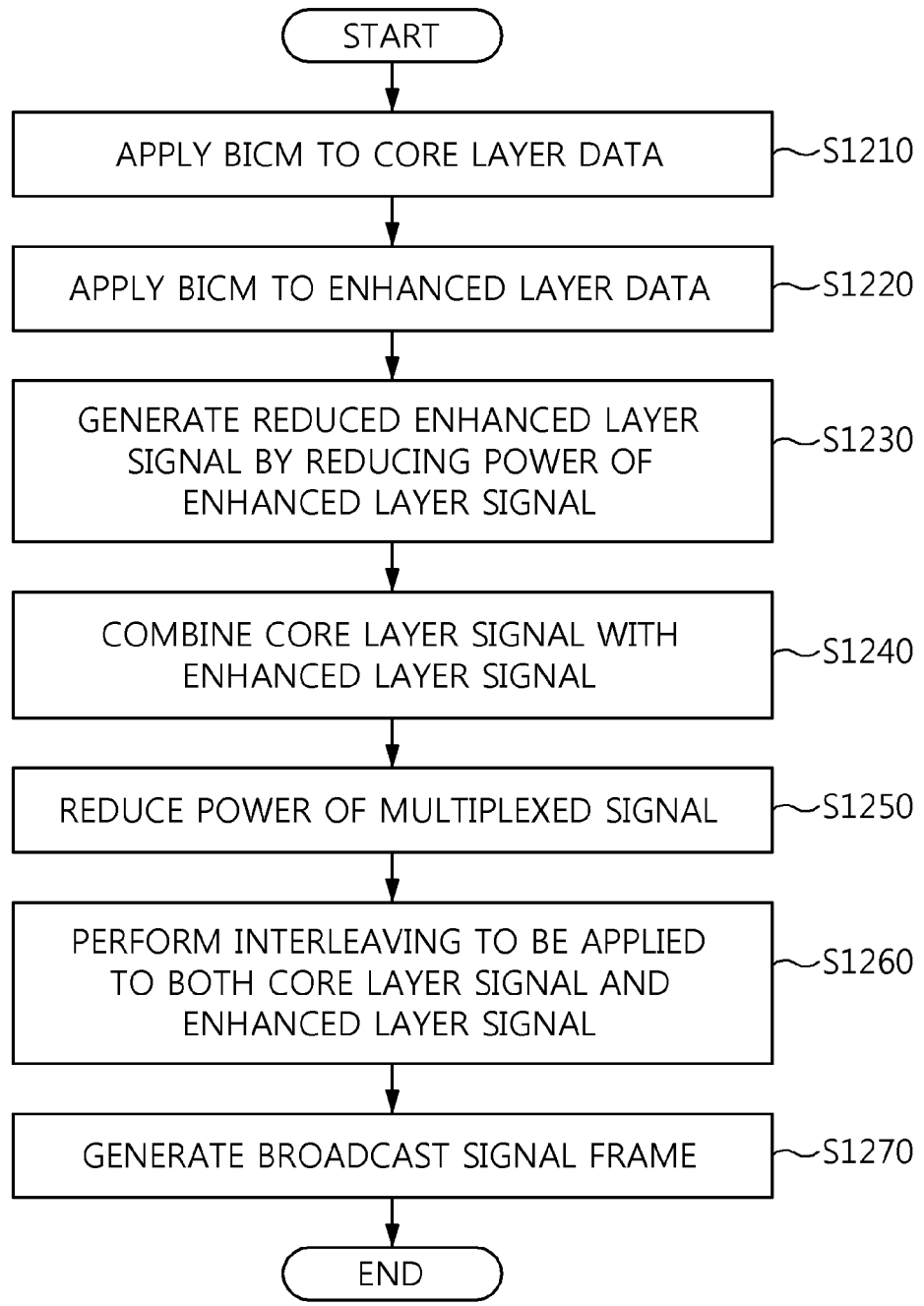
FIG. 14 is an operation flowchart showing a method of generating broadcast signal frame according to an embodiment of the present invention.

FIG. 14 is an operation flowchart showing a method of generating broadcast signal frame according to an embodiment of the present invention.

Referring to FIG. 14, in the method according to the embodiment of the present invention, BICM is applied to core layer data at step S1210.

Furthermore, in the method according to the embodiment of the present invention, BICM is applied to enhanced layer data at step S1220.

The BICM applied at step S1220 may be different from the BICM applied to step S1210. In this case, the BICM applied at step S1220 may be less robust than the BICM applied to step S1210. In this case, the bit rate of the BICM applied at step S1220 may be less robust than that of the BICM applied to step S1210.

In this case, an enhanced layer signal may correspond to the enhanced layer data that is restored based on cancellation corresponding to the restoration of the core layer data corresponding to a core layer signal.

Furthermore, in the method according to the embodiment of the present invention, a power-reduced enhanced layer signal is generated by reducing the power of the enhanced layer signal at step S1230.

In this case, at step S1230, an injection level may be changed from 00 dB to 25.0 dB in steps of 0.5 dB or 1 dB.

Furthermore, in the method according to the embodiment of the present invention, a multiplexed signal is generated by combining the core layer signal and the power-reduced enhanced layer signal at step S1240.

That is, at step S1240, the core layer signal and the enhanced layer signal are combined at different power levels so that the power level of the enhanced layer signal is lower than the power level of the core layer signal.

In this case, at step S1240, one or more extension layer signals having lower power levels than the core layer signal and the enhanced layer signal may be combined with the core layer signal and the enhanced layer signal.

Furthermore, in the method according to the embodiment of the present invention, the power of the multiplexed signal is reduced at step S1250.

In this case, at step S1250, the power of the multiplexed signal may be reduced to the power of the core layer signal. In this case, at step S1250, the power of the multiplexed signal may be reduced by a level by which the power has been increased at step S1240.

Furthermore, in the method according to the embodiment of the present invention, a time-interleaved signal is generated by performing time interleaving that is applied to both the core layer signal and the enhanced layer signal is performed at step S1260.

Furthermore, in the method according to the embodiment of the present invention, a broadcast signal frame including a preamble for signaling time interleaver information shared by the core layer signal and the enhanced layer signal is generated using the time-interleaved signal at step S1270.

In this case, the step S1270 may include generating the bootstrap; generating the preamble; and generating a superimposed payload corresponding to the time-interleaved signal.

In this case, the preamble may include a PLP identification information for identifying Physical Layer Pipes (PLPs); and a layer identification information for identifying layers corresponding to division of layers.

In this case, the PLP identification information and the layer identification information may be included in the preamble as fields different from each other.

In this case, the time interleaver information may be included in the preamble for each of the Physical Layer Pipes (PLPs) without checking a condition of a conditional statement corresponding to the layer identification information (j).

In this case, the preamble may selectively include an injection level information corresponding to the injection level controller for each of the Physical Layer Pipes (PLPs) based on a result of comparing (IF(j>0)) the layer identification information with a predetermined value.

In this case, the bootstrap may be shorter than the preamble, and have a fixed-length.

In this case, the bootstrap may include a symbol representing a structure of the preamble, the symbol corresponding to a fixed-length bit string representing a combination of a modulation scheme/code rate, a FFT size, a guard interval length and a pilot pattern of the preamble.

In this case, the symbol may correspond to a lookup table in which a preamble structure corresponding to a second FFT size is allocated prior to a preamble structure corresponding to a first FFT size, the second FFT size being less than the first FFT size when the modulation scheme/code rates are the same, and a preamble structure corresponding to a second guard interval length is allocated prior to a preamble structure corresponding to a first guard interval length, the second guard interval length being longer than the first guard interval length when the modulation scheme/code rates are the same and the FFT sizes are the same.

In this case, the broadcast signal frame may be an ATSC 3.0 frame.

In this case, the L1 signaling information may include injection level information and/or normalizing factor information.

Although not explicitly shown in FIG. 14, the method may further include the step of generating signaling information including injection level information corresponding to step S1230. In this case, the signaling information may be L1 signaling information.

The method of generating broadcast signal frame shown in FIG. 14 may correspond to step S210 shown in FIG. 2.

Figure 15:
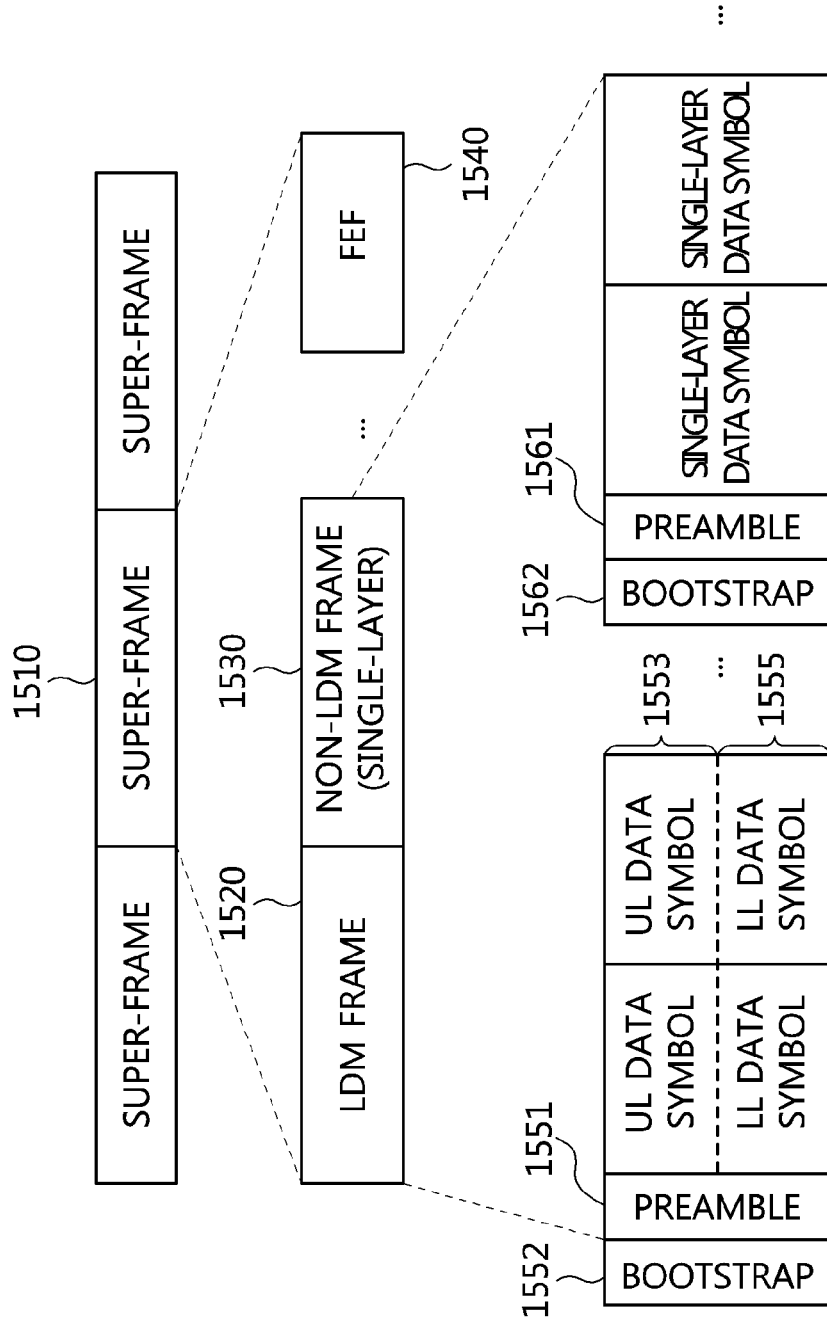
FIG. 15 is a diagram showing a structure of a super-frame which includes broadcast signal frames according to an embodiment of the present invention.

FIG. 15 is a diagram showing a structure of a super-frame which includes broadcast signal frames according to an embodiment of the present invention.

Referring to FIG. 15, the super-frame based on the Layered Division Multiplexing (LDM) configures at least one of frame, and each frame configures at least one of OFDM symbol.

In this case, each OFDM symbol may start with at least one preamble symbol. Moreover, the frame may include a reference symbol or a pilot symbol.

The super-frame 1510 illustrated in FIG. 15, may include a LDM frame 1520, a single layer frame without LDM 1530 and a Future Extension Frame (FEF) for future extensibility 1540 and may be configured using Time Division Multiplexing (TDM).

The LDM frame 1520 may include an Upper Layer (UL) 1553 and a Lower Layer (LL) 1555 when two layers are applied.

In this case, the upper layer 1553 may correspond to the core layer and the lower layer 1555 may correspond to the enhanced layer.

In this case, the LDM frame 1520 which includes the upper layer 1553 and the lower layer 1555 may a bootstrap 1552 and a preamble 1551.

In this case, the upper layer data and the lower layer data may share the time interleaver for reducing complexity and memory size and may use the same frame length and FFT size.

Moreover, the single-layer frame 1530 may include the bootstrap 1562 and the preamble 1561.

In this case, the single-layer frame 1530 may use a FFT size, time interleaver and frame length different from the LDM frame 1520. In this case, the single-layer frame 1530 may be multiplexed with the LDM frame 1520 in the super-frame 1510 based on TDM scheme.

Figure 16:
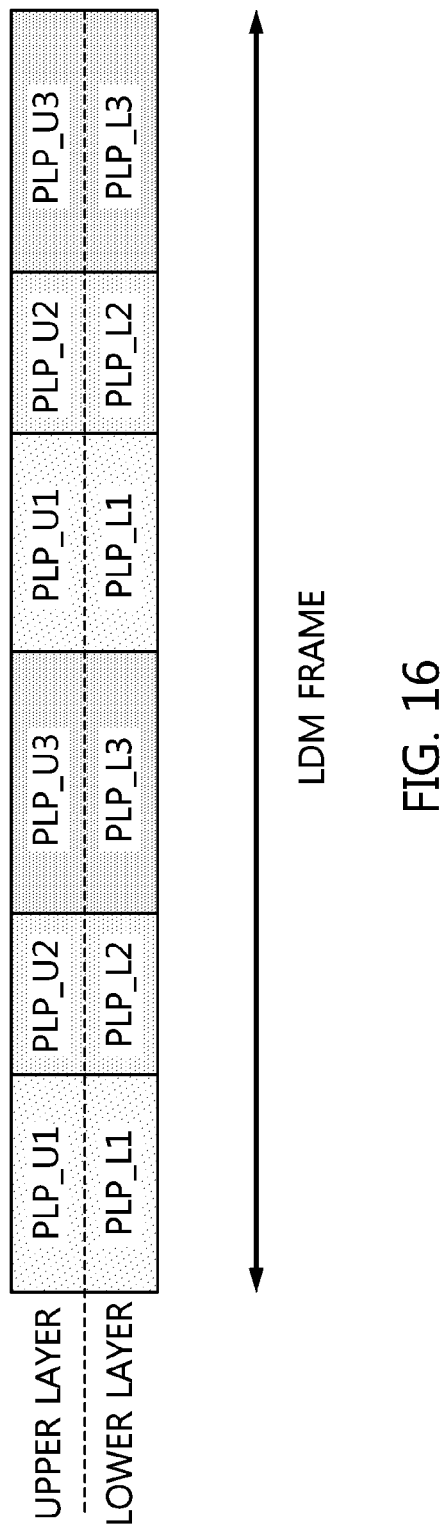
FIG. 16 is a diagram showing an example of a LDM frame including multiple-physical layer pipes.

FIG. 16 is a diagram showing an example of a LDM frame including multiple-physical layer pipes.

Referring to FIG. 16, total six physical layer pipes (PLPs) are assigned when the physical layer pipes (PLPs) are divided into three in time and two layers are applied.

In this case, the layer-divided PLPs may have the same time interleaver length, time interleaver type and PLP size for reducing complexity and memory size.

In accordance with the embodiments, the layer-divided PLPs may have PLP sizes different from one another, and information for identifying the stat position of the PLP or information for identifying the size of the PLP may be signaled.

Figure 17:
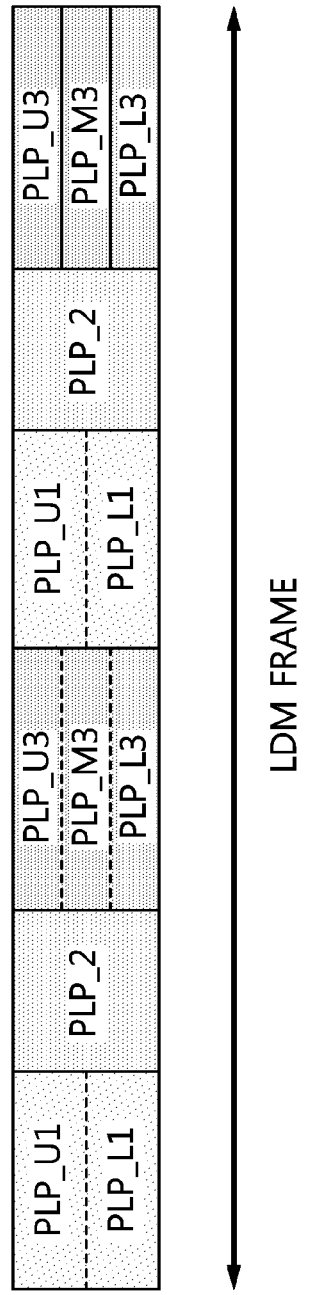
FIG. 17 is a diagram showing another example of a LDM frame including multiple-physical layer pipes.

FIG. 17 is a diagram showing another example of a LDM frame including multiple-physical layer pipes.

Referring to FIG. 17, two layers (PLP_U1, PLP_L1), one layer (PLP_2) and three layers (PLP_U3, PLP_M3, PLP_L3) may be applied together for configuring the frame including PLPs when the PLPs are divided into three in time.

In this case, the layer identification information for identifying layers may be signaled using 2-bit NUM_LAYER field.

Figure 18:
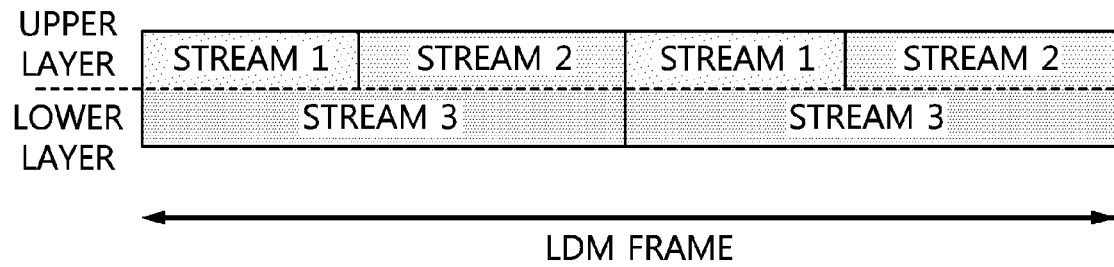
FIG. 18 is a diagram showing an example of the a LDM frame using multiple-physical layer pipes for providing a service having three robustness levels.

FIG. 18 is a diagram showing an example of the a LDM frame using multiple-physical layer pipes for providing a service having three robustness levels.

Referring to FIG. 18, the three services are provided using the LDM frame as follows:

Stream 1: Ultra-robust audio service
Stream 2: HD mobile/indoor service (720p or 1080p)
Stream 3: 4K UHD service The upper layer illustrated in FIG. 18 may correspond to the core layer and the lower layer may correspond to the enhanced layer.

Figure 19:
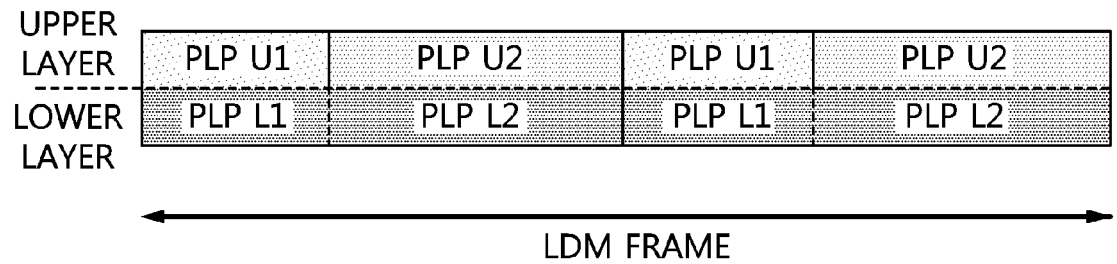
FIG. 19 is a diagram showing physical layer pipes of the LDM frame shown in FIG. 18.

FIG. 19 is a diagram showing physical layer pipes of the LDM frame shown in FIG. 18.

Referring to FIG. 19, the stream 3 of the lower layer is divided into PLP_L1 which uses the same PLP size and time interleaver as the stream 1 of the upper layer and PLP_L2 which uses the same PLP size and time interleaver as the stream 2 of the upper layer.

In this case, information such as PLP_GROUP_ID for indicating that the PLP_L1 and the PLP_L2 correspond to the same service, may be signaled.

In accordance with embodiments, PLPs which have sizes different from one another may be used for each layer. In this case, the services may be identified using PLP identifiers.

The PLP start position and PLP size may be signaled for each PLP when the different-size PLPs for each layer are used.

The following pseudo code is for showing an example of fields included in the preamble according to an embodiment of the present invention. The following pseudo code may be included in the L1 signaling information of the preamble.

```
[Pseudo Code]
SUB_SLICES_PER_FRAME                    (15 bits)
NUM_PLP                                 (8 bits)
NUM_AUX                                 (4 bits)
AUX_CONFIG_RFU                          (8 bits)
for i=0.. NUM_RF-1 {
    RF_IDX                              (3 bits)
    FREQUENCY                           (32 bits)
}
IF S2=='xxx1' {
    FEF_TYPE                            (4 bits)
    FEF_LENGTH                          (22 bits)
    FEF_INTERVAL                        (8 bits)
}
for i=0 .. NUM_PLP-1{
    NUM_LAYER                           (2~3 bits)
    for j=0 .. NUM_LAYER-1{
    / * Signaling for each layer */
        PLP_ID (i, j)                   (8 bits)
        PLP_GROUP_ID                    (8 bits)
        PLP_TYPE                        (3 bits)
        PLP_PAYLOAD_TYPE                (5 bits)
        PLP_COD                         (4 bits)
        PLP_MOD                         (3 bits)
        PLP_SSD                         (1 bit)
        PLP_FEC_TYPE                    (2 bits)
        PLP_NUM_BLOCKS_MAX              (10 bits)
        IN_BAND_A_FLAG                  (1 bit)
        IN_BAND_B_FLAG                  (1 bit)
        PLP_MODE                        (2 bits)
        STATIC_PADDING_FLAG             (1 bit)
        IF (j > 0)
            LL_INJECTION_LEVEL          (3~8 bits)
    } / * End of NUM_LAYER loop */
    / * Common signaling for all layers */
    FF_FLAG                             (1 bit)
    FIRST_RF_IDX                        (3 bits)
    FIRST_FRAME_IDX                     (8 bits)
    FRAME_INTERVAL                      (8 bits)
    TIME_IL_LENGTH                      (8 bits)
    TIME_IL_TYPE                        (1 bit)
    RESERVED_1                          (11 bits)
    STATIC_FLAG                         (1 bit)
}/*End of NUM_PLP loop */
FEF_LENGTH_MSB                          (2 bits)
RESERVED_2                              (30 bits)
for i=0 .. NUM_AUX-1 {
    AUX_STREAM_TYPE                     (4 bits)
    AUX_PRIVATE_CONF                    (28 bits)
}
```

The NUM_LAYER may correspond to two bits or three bits in the above pseudo code. In this case, the NUM_LAYER may be a field for identifying the number of layers in each PLP which is divided in time. In this case, the NUM_LAYER may be defined in the NUM_PLP loop so that the number of the layers can be different for each PLP which is divided in time.

The LL_INJECTION_LEVEL may correspond to 3~8 bits. In this case, the LL_INJECTION_LEVEL may be a field for identifying the injection level of the lower layer (enhanced layer). In this case, the LL_INJECTION_LEVEL may correspond to the injection level information.

In this case, the LL_INJECTION_LEVEL may be defined from the second layer (j>0) when the number of layers is two or more.

The fields such as PLP_ID(i,j), PLP_GROUP_ID, PLP_TYPE, PLP_PAYLOAD_TYPE, PLP_COD, PLP_MOD, PLP_SSD, PLP_FEC_TYPE, PLP_NUM_BLOCKS_MAX, IN_BAND_A_FLAG, IN_BAND_B_FLAG, PLP_MODE, STATIC_PADDING_FLAG, etc. may correspond to parameters which are defined for each layer, and may be defined inside of the NUM_LAYER loop.

In this case, the PLP_ID(i,j) may correspond to the PLP identification information and the layer identification information. For example, the 'i' of the PLP_ID(i,j) may correspond to the PLP identification information and the 'j' of the PLP_ID(i,j) may correspond to the layer identification information.

In accordance with embodiments, the PLP identification information and the layer identification information may be included in the preamble as fields different from each other.

Moreover, the time interleaver information such as the TIME_IL_LENGTH and TIME_IL_TYPE, etc., the FRAME INTERVAL which is related to the PLP size and fields such as FF_FLAG, FIRST_RF_IDX, FIRST_FRAME_IDX, RESERVED_1, STATIC_FLAG, etc. may be defined outside of the NUM_LAYER loop and inside of the NUM_PLP loop.

As described above, the apparatus and method for generating broadcast signal frame according to the present invention are not limited to the configurations and methods of the aforementioned embodiments, but some or all of the embodiments may be selectively combined such that the embodiments are modified in various manners.

The invention claimed is:

1. A broadcast signal reception apparatus, comprising:
a time deinterleaver configured to perform time deinterleaving on a received signal corresponding to a broadcast signal frame, the broadcast signal frame including a preamble for signaling time interleaver information;
a core layer Bit-Interleaved Coded Modulation (BICM) decoder configured to restore core layer data corresponding to the broadcast signal frame;
an enhanced layer symbol extractor configured to extract enhanced layer symbols by performing cancellation corresponding to the core layer data using the output from the core layer BICM decoder; and
an enhanced layer BICM decoder configured to restore enhanced layer data corresponding to the enhanced layer symbols,
wherein the time interleaver information is information about a time interleaver operation,
wherein the broadcast signal frame corresponds to a multiplexed signal, the multiplexed signal corresponding to a combination of a core layer signal and a power-reduced enhanced layer signal,
wherein the power-reduced enhanced layer signal is generated corresponding to a scaling factor and the power of the multiplexed signal is reduced corresponding to a normalizing factor in a transmitter, and
wherein the scaling factor decreases as a reduction in power corresponding to the power-reduced enhanced layer signal becomes larger, and the normalizing factor increases as the reduction in power becomes larger.

2. The broadcast signal reception apparatus of claim 1, wherein the preamble includes a PLP identification information for identifying Physical Layer pipes (PLPs) and a layer identification information for identifying layers.

3. The broadcast signal reception apparatus of claim 2, wherein the time interleaver information is included in the preamble for each of the Physical Layer Pipes (PLPs) inside of a NUM_PLP loop independently of the layer identification information.

4. A broadcast signal reception method, comprising:
performing time deinterleaving on a received signal corresponding to a broadcast signal frame, the broadcast signal frame including a preamble for signaling time interleaver information;
restoring, by a core layer Bit-Interleaved Coded Modulation (BICM) decoder, core layer data corresponding to the broadcast signal frame;
extracting enhanced layer symbols by performing cancellation corresponding to the core layer data using the output from the core layer BICM decoder; and
restoring, by an enhanced layer BICM decoder, enhanced layer data corresponding to the enhanced layer symbols,
wherein the time interleaver information is information about a time interleaver operation,
wherein the broadcast signal frame corresponds to a multiplexed signal, the multiplexed signal corresponding to a combination of a core layer signal and a power-reduced enhanced layer signal,
wherein the power-reduced enhanced layer signal is generated corresponding to a scaling factor and the power of the multiplexed signal is reduced corresponding to a normalizing factor in a transmitter, and
wherein the scaling factor decreases as a reduction in power corresponding to the power-reduced enhanced layer signal becomes larger, and the normalizing factor increases as the reduction in power becomes larger.

* * * * *